US012772824B2

(12) United States Patent
Mignot et al.

(10) Patent No.: US 12,772,824 B2
(45) Date of Patent: Oct. 20, 2026

(54) ASYMMETRIC GATE CONTACT OVER SOURCE/DRAIN CONTACT

(71) Applicant: International Business Machines Corporation, Armonk, NY (US)

(72) Inventors: Yann Mignot, Slingerlands, NY (US); Shahab Siddiqui, Clifton Park, NY (US); Chanro Park, Clifton Park, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 640 days.

(21) Appl. No.: 18/129,048

(22) Filed: Mar. 30, 2023

(65) Prior Publication Data

US 2024/0332182 A1 Oct. 3, 2024

(51) Int. Cl.

| | |
|---|---|
| ***H10W 20/41*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.
CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01)

(58) Field of Classification Search
CPC .. H10D 30/014; H10D 30/6729; H10D 30/43; H10D 30/6735; H10D 62/121; H10D 64/01; H10D 64/20–529; H10D 64/01324; H10W 20/427
See application file for complete search history.

(56) References Cited

U.S. PATENT DOCUMENTS

| | | | | |
|---|---|---|---|---|
| 11,004,789 | B2 | 5/2021 | Doornbos et al. | |
| 11,011,604 | B2 | 5/2021 | Zang | |
| 11,293,208 | B2 | 4/2022 | Heimbach | |
| 2019/0280113 | A1* | 9/2019 | Hook ..................... | H10D 30/63 |
| 2021/0336019 | A1 | 10/2021 | Su et al. | |
| 2021/0376155 | A1 | 12/2021 | Chang et al. | |

(Continued)

FOREIGN PATENT DOCUMENTS

| | | | |
|---|---|---|---|
| KR | 20210086460 | A | 7/2021 |
| TW | 202143485 | A | 11/2021 |

*Primary Examiner* — Davienne N Monbleau
*Assistant Examiner* — Heim Kirin Grewal
(74) *Attorney, Agent, or Firm* — Harrity & Harrity, LLP

(57) ABSTRACT

A MOSFET includes a semiconductor substrate that has a frontside and a backside; a metal gate at the frontside of the substrate; a first source/drain structure at the frontside of the substrate, adjacent to the metal gate in a first direction; and a first source/drain contact at the frontside of the first source/drain structure. Also included are a backside power rail at the backside of the substrate; and a recessed via that connects the first source/drain contact through the substrate to the backside power rail. The recessed via is adjacent to the first source/drain structure in a direction perpendicular to the first direction. A dielectric cap covers a frontside of the first source/drain contact. A gate contact is disposed at a frontside of the dielectric cap. The gate contact at least partly overlies the first source/drain contact.

20 Claims, 19 Drawing Sheets

(56) References Cited

U.S. PATENT DOCUMENTS

| | | | |
|---|---|---|---|
| 2021/0407999 A1 | 12/2021 | Huang et al. | |
| 2022/0093766 A1 | 3/2022 | Chen | |
| 2022/0130759 A1 | 4/2022 | Huang et al. | |
| 2022/0173223 A1 | 6/2022 | Yu | |
| 2022/0181259 A1 | 6/2022 | Chiang | |
| 2022/0262791 A1 | 8/2022 | Shi et al. | |
| 2022/0344496 A1* | 10/2022 | Su ........................ | H10D 30/024 |
| 2025/0096043 A1* | 3/2025 | Hsiung ............... | H10W 20/069 |

* cited by examiner

4100

6000

ASYMMETRIC GATE CONTACT OVER SOURCE/DRAIN CONTACT

BACKGROUND

The present invention relates to the electrical, electronic, and computer arts, and more specifically, to metal-oxide-semiconductor field effect transistors (MOSFETs).

Transistor feature sizes continue to get smaller and larger numbers of transistors are packed into smaller areas on chips. However, there are physical limits to how close metal lines and vias can be placed without causing dielectric breakdown and electrical shorts between adjacent metal features. This means that current techniques for laying out integrated circuits limit how closely transistors can be packed, regardless of the achievable process dimensions for the transistor feature sizes, due to the physical limits of the metal lines, vias, and dielectric.

Referring to FIG. 1, which depicts a prior art MOSFET device 100 that is formed on a substrate 101, a gap 1GA separates metal lines 102.1 and 102.2. Vias 104.1, 104.2 connect the metal lines to source/drain contact 1CA1 and gate contact 1CB. Source/drain contact 1CA2 flanks gate contact 1CB and limits how far the gate contact can be placed from source/drain contact 1CA1. A gap 1GB separates contacts 1CA1, 1CB. As feature sizes of gate 108 and source/drain structures 106.1, 106.2 diminish, spacing between the source/drain contact 1CA1 and the gate contact 1CB is reduced so that the gaps 1GA, 1GB get smaller. As gaps 1GA, 1GB get smaller, for a given gate bias voltage, risk of interlayer dielectric 110 breaking down (shorting between contacts 1CA1 and 1CB, vias 104.1 and 104.2, and/or lines 102.1 and 102.2) increases. Thus, the physical properties of the dielectric limit how close the lines and vias can be placed, which in turn limits how close the transistors can be packed, regardless of advances in transistor feature size.

SUMMARY

Principles of the invention provide techniques for an asymmetric gate contact over a source/drain contact.

In one aspect, an exemplary metal-oxide-semiconductor field effect transistor (MOSFET) includes a semiconductor substrate that has a frontside and a backside; a metal gate at the frontside of the substrate; a first source/drain structure at the frontside of the substrate, adjacent to the metal gate in a first direction; and a first source/drain contact at the frontside of the first source/drain structure. Also included are a backside power rail at the backside of the substrate; and a recessed via that connects the first source/drain contact through the substrate to the backside power rail. The recessed via is adjacent to the first source/drain structure in a direction perpendicular to the first direction. A dielectric cap covers a frontside of the first source/drain contact. A gate contact is disposed at a frontside of the dielectric cap. The gate contact at least partly overlies the first source/drain contact.

According to another aspect, an exemplary method includes, in a metal-oxide-semiconductor field effect transistor (MOSFET) that has a plurality of source/drain structures with corresponding source/drain contacts, with a first of the source/drain contacts connected to a power via: etching the first source/drain contact and the power via so that their top surfaces are lower than top surfaces of adjacent source/drain contacts, thereby forming a pocket in a layer of first dielectric that is adjacent to the source/drain contacts.

In view of the foregoing, techniques of the present invention can provide substantial beneficial technical effects. For example, one or more embodiments overcome current limitations of transistor packing density due to the physical limits of the metal lines, vias, and dielectric. Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
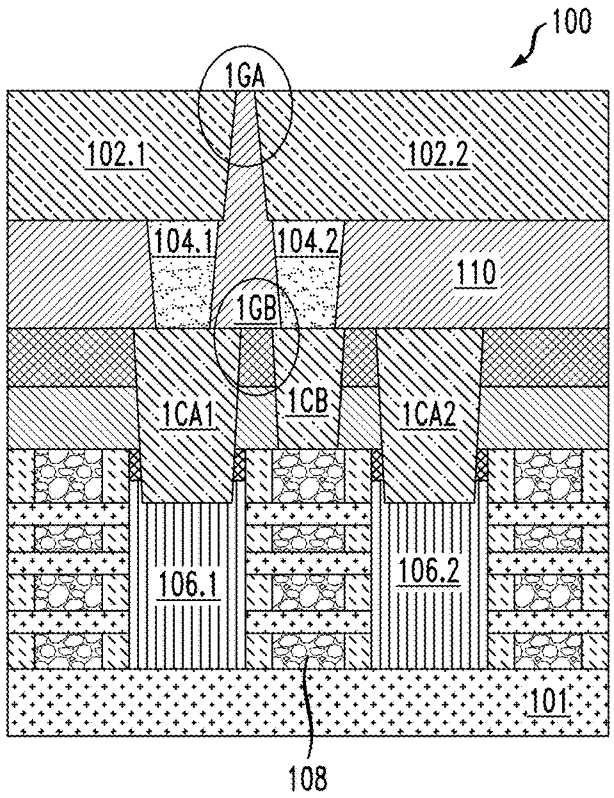
FIG. 1 PRIOR ART
FIG. 1 depicts a prior art MOSFET device.
Figure 2:
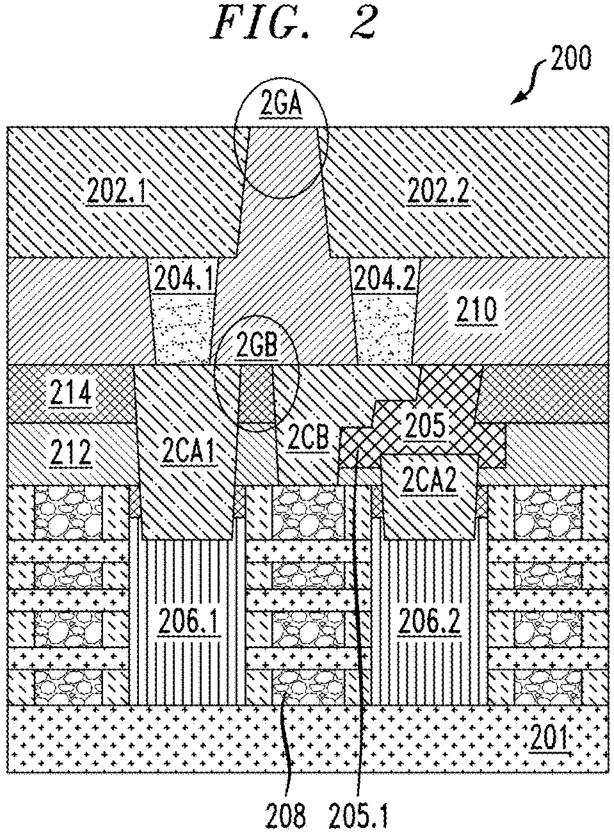
FIG. 2 depicts a MOSFET device with an asymmetric gate contact over the source/drain contact, according to exemplary embodiments.
Figure 3:
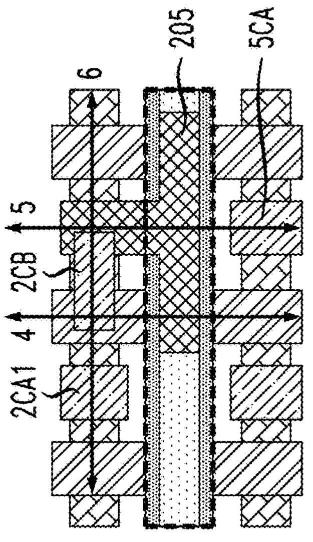
FIG. 3 through FIG. 6 depict details of the MOSFET device that is shown in FIG. 2.

FIG. 2 depicts a MOSFET device 200 that is formed on a substrate 201. The device 200 has an asymmetric gate contact 2CB over a source/drain contact 2CA2, according to exemplary embodiments. In the device 200, gap 2GA between metal lines 202.1, 202.2 and gap 2GB between contacts 2CA1, 2CB both are sufficiently large such that interlayer dielectric 210 and interlayer dielectric 212 are not at risk of breaking down for a given gate voltage. Regarding "sufficiently large," the ordinary skilled worker is familiar with the equations that describe whether a dielectric will break down (i.e. whether an arc will occur through the dielectric) for given values of dielectric constant, thickness, and voltage. For reasons well known to the ordinary skilled worker, it is desirable to have the dielectric constant of the dielectric 210 be less than or equal to the dielectric constant of silicon dioxide (i.e., in one or more embodiments, dielectric 210 is a "low-k" dielectric). The skilled artisan is familiar with low-k dielectrics; i.e., materials having a small relative dielectric constant, k, relative to silicon dioxide (fluorinated silica glass, organosilicate glass, porous silicon dioxide, porous organosilicate glass, spin-on organic polymers, spin-on silicon-based polymers, and the like). The shape of the asymmetric gate contact 2CB permits placing the vias 204.1, 204.2 sufficiently far apart that dielectric breakdown is not a risk, even for a critical dimension of the gate 208 on the order of 12 nanometers (nm), critical dimensions of the source/drain structures 206.1, 206.2 on the order of 14 nm, and gate bias voltage on the order of 1 V. This is the case even when the source/drain contact 2CA1 is the full width of the source/drain structure 206.1. A dielectric cap 205 with an ear 205.1 electrically isolates the gate contact 2CB from the source/drain contact 2CA2. For reasons that will become apparent from further discussion of a method for fabricating the MOSFET device 200, the dielectric cap 205 is formed of a material different than the silicon nitride layer 212 and the silicon dioxide interlayer dielectric 214.

In FIG. 2, the gate 208 represents collectively a "gate stack" of gate dielectric, work function material (WFM), and conductive gate metal for each field effect transistor (FET) in a complementary metal-oxide-semiconductor (CMOS) structure, where the WFM for an n-type FET (nFET) is different (lower work function) than the WFM for a p-type FET (pFET), as will be appreciated by the skilled worker.

The ordinary skilled worker is familiar with gate stacks. For example, gate stacks in both nFET and pFET structures (in embodiments having both n- and p-type devices) include a gate dielectric, such as $HfO_2$, $ZrO_2$, $HfSiO_x$, $HfLaO_x$, etc., and work function material (WFM) layers. Non-limiting examples of suitable work function (gate) metals include p-type work function materials and n-type work function materials. P-type work function materials include compositions such as ruthenium, palladium, platinum, cobalt, nickel, and conductive metal nitride like TiN, WN, or any combination thereof. N-type work function materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function material(s) may be deposited by a suitable deposition process, for example, atomic layer deposition (ALD), chemical vapor deposition (CVD), plasma enhanced CVD (PECVD), physical vapor deposition (PVD), plating, and thermal or e-beam evaporation. Advantageously, in one or more embodiments, pinch-off of work function material between semiconductor fins is essentially avoided during deposition. The WFM layer is removed from one of the nFET and pFET regions in structures including both types of regions while the other region is protected. An SC1 etch (defined below), an SC2 etch (defined below) or other suitable etch processes can be employed to remove the selected portion of the originally deposited WFM layer. A new WFM layer suitable for the region is then deposited. Accordingly, an nFET device will include a WFM layer (gate electrode) having a first composition while a pFET device will have a WFM layer having a second composition. For example, the WFM employed in an nFET device may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET device may, for example, be a TiN, TiC, TaN or a tungsten (W) layer. The threshold voltage (Vt) of nFET devices is sensitive to the thickness of work function materials such as titanium nitride (TiN).

The contacts 2CA1, 2CA2, 2CB, 5CA (shown in FIG. 5 and FIG. 6) are formed of contact material. Contact material may, for example, alternatively include a silicide liner such as Ti, Ni, NiPt, an adhesion metal liner such as TiN and low resistance metal fills such as W, Co, Ru, Cu, etc. The contact material may be deposited by, for example, ALD, CVD, PECVD, PVD, plating, thermal or e-beam evaporation, or sputtering. A planarization process such as chemical mechanical polishing (CMP) is performed to remove any electrically conductive material (overburden) from the top surface of the structure.

Figure 6:
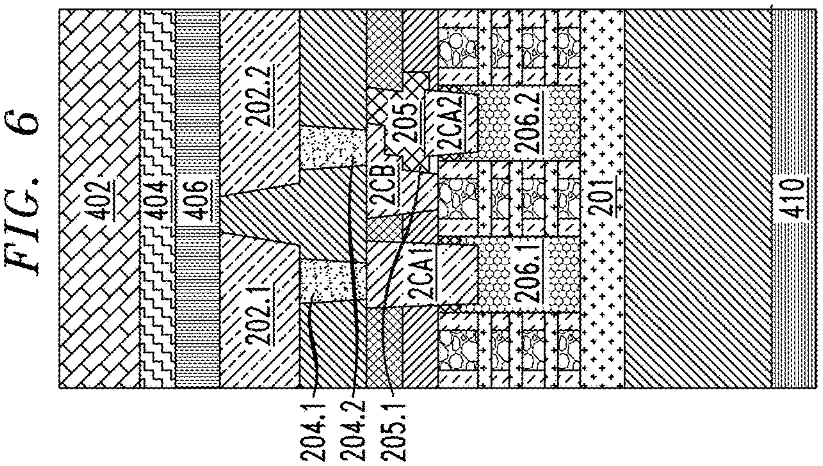
Figure 5:
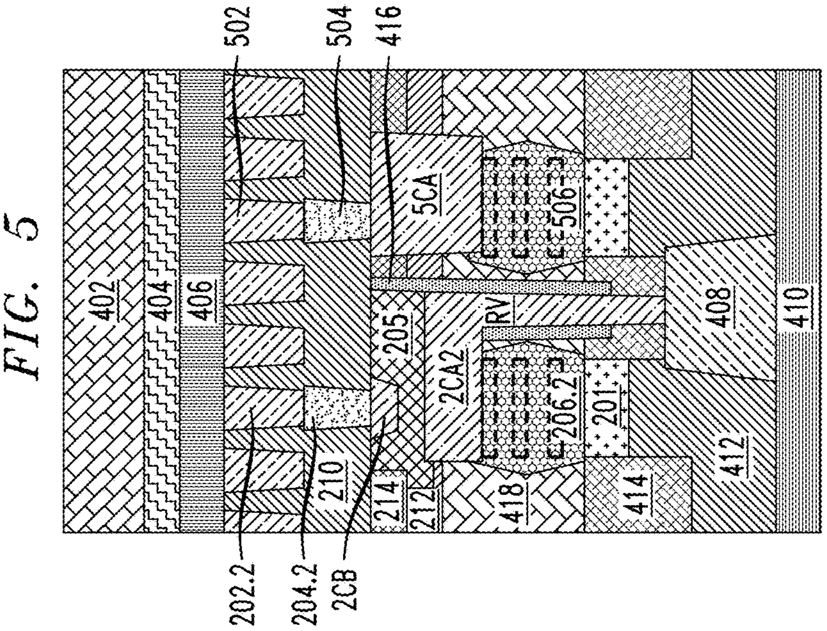
Figure 4:
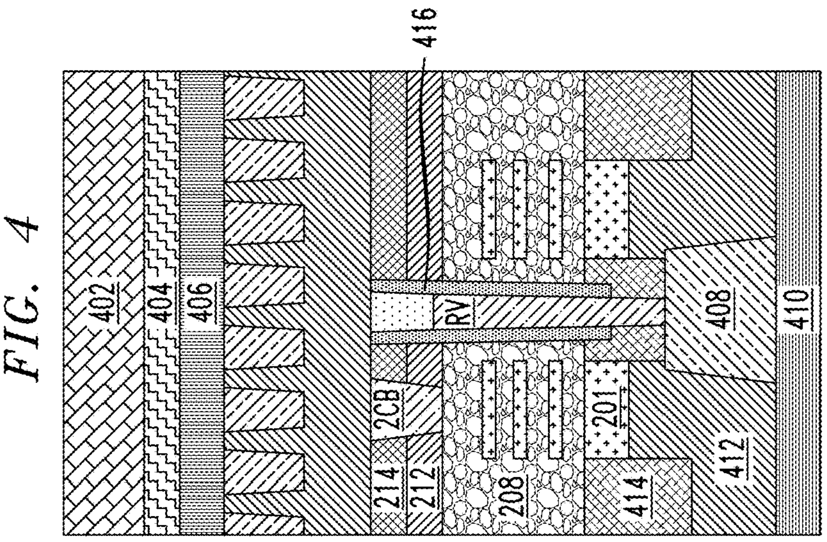

FIG. 3 through FIG. 6 depict details of the MOSFET device 200. FIGS. 4, 5, and 6 are cross sections taken at corresponding section lines 4, 5, and 6 of the top view of FIG. 3 (and similarly throughout the drawings). In addition to the structures already discussed with reference to FIG. 2, the device 200 also includes a carrier wafer 402, a bonding oxide layer 404, a frontside interconnect 406 (in one or more embodiments including both signal and power connections), a backside power rail 408, a backside power distribution network 410, a backside interlayer dielectric 412, shallow trench isolation 414, a dielectric spacer 416, interlayer dielectric 418, a recessed via RV, a source/drain structure 506, and a source/drain contact 5CA.

Shallow trench isolation (STI) may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. STI may be formed to a height above the height of substrate and reveal at least some portion of precursor insulator layer. STI may be formed by CVD or ALD dielectric deposition followed by chemical mechanical planarization (CMP) and recessing.

Figure 7:
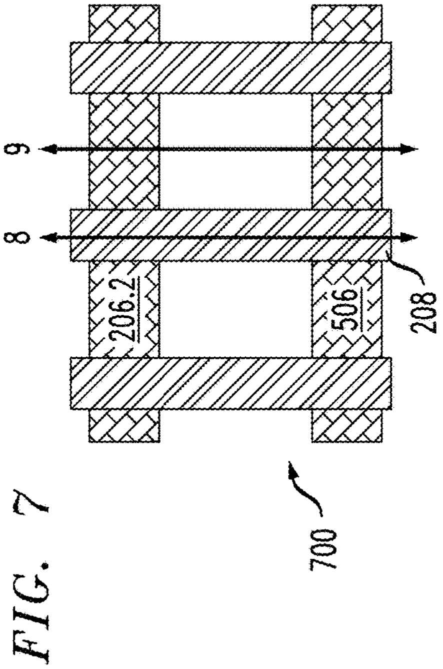
FIG. 7 through FIG. 63 depict intermediate structures in a method for fabricating the MOSFET device that is shown in FIG. 2.
Figure 63:
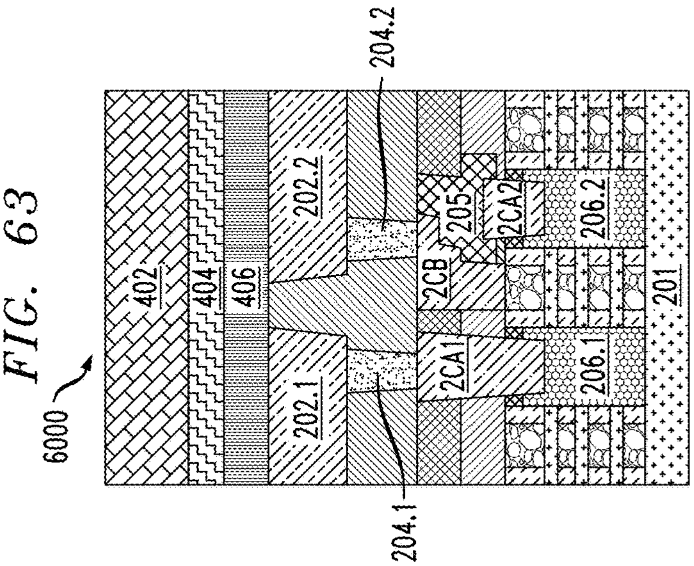
Figure 64:
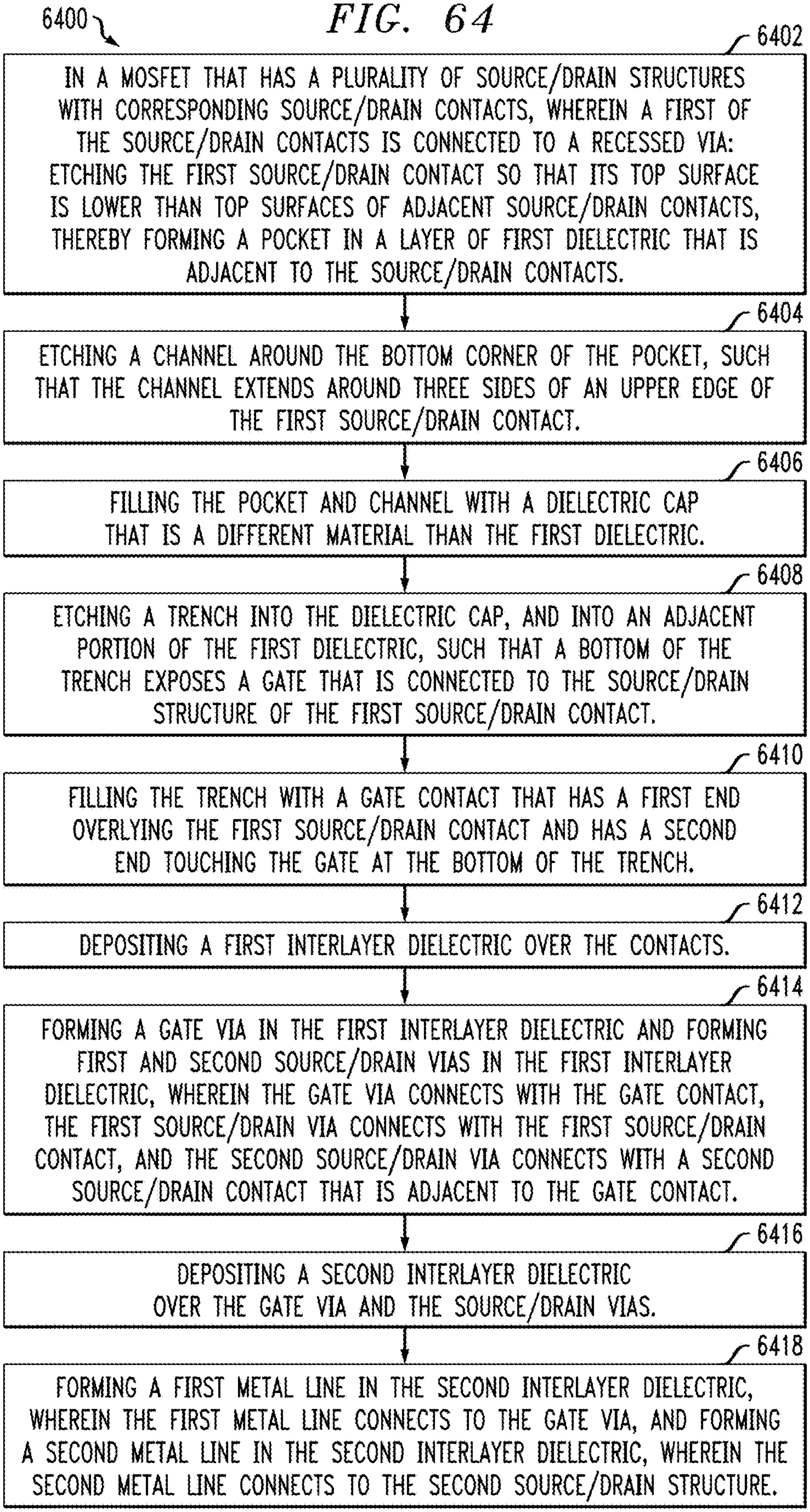
FIG. 64 is a flow chart that depicts key steps of the method that is shown in FIG. 7 through FIG. 63 for fabricating the MOSFET device that is shown in FIG. 2.

FIG. 7 through FIG. 63 depict intermediate structures in a method 6400 for fabricating the MOSFET device 200. FIG. 64 is a flow chart that depicts key steps of the method 6400.

Figure 9:
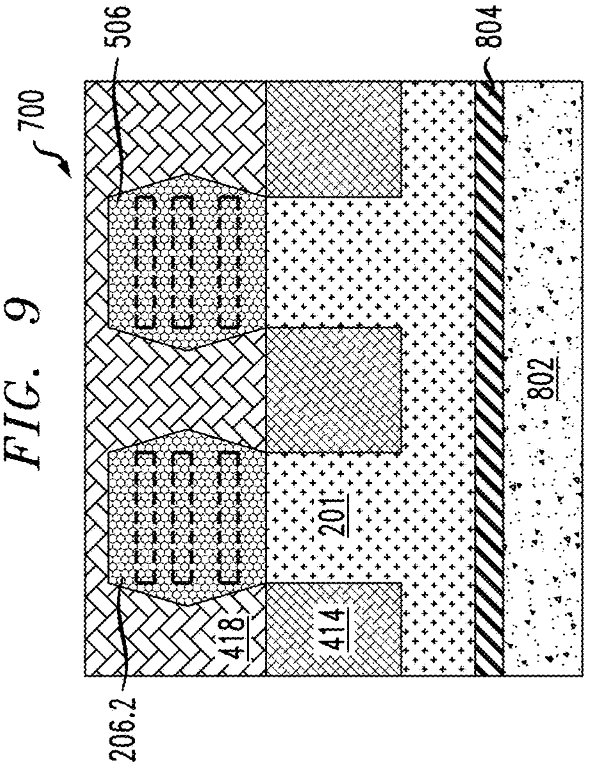
Figure 8:
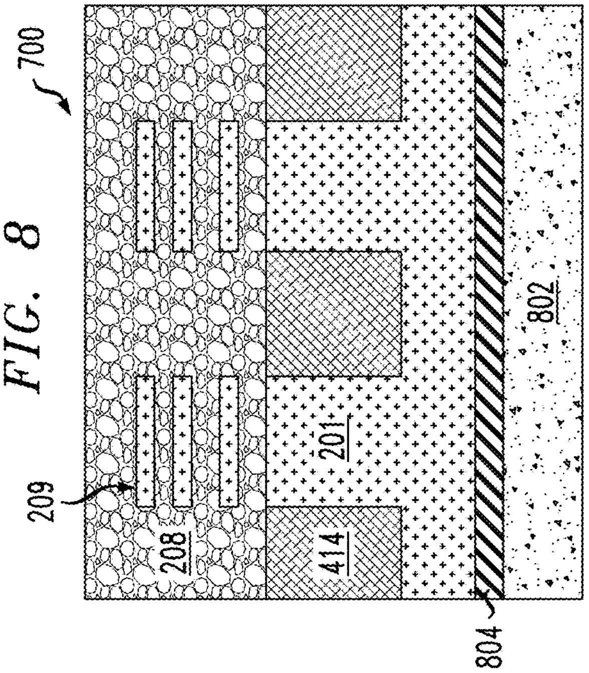

Referring to FIG. 7 through FIG. 9, gate 208 is formed on substrate 201 along with source/drain contacts 206.2, 506 in an intermediate structure 700. FIG. 8 and FIG. 9 are taken at a corresponding section line of FIG. 7. Interlayer dielectric 418 and shallow trench isolation 414 electrically isolate the source/drain structures from each other. The substrate 201 includes base layer 802 and etch stop layer 804. Commonly used etch stop materials include $SiO_2$ or epitaxial SiGe, and the like. In one or more embodiments, the gate 208 is a gate-all-around (GAA) structure that surrounds nanosheet channels 209. However, embodiments are not limited to GAA structures. A FinFET structure is one of several alternatives.

Figure 10:
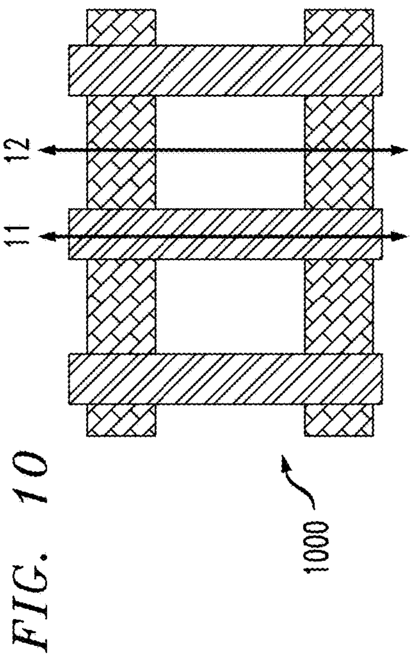
Figure 12:
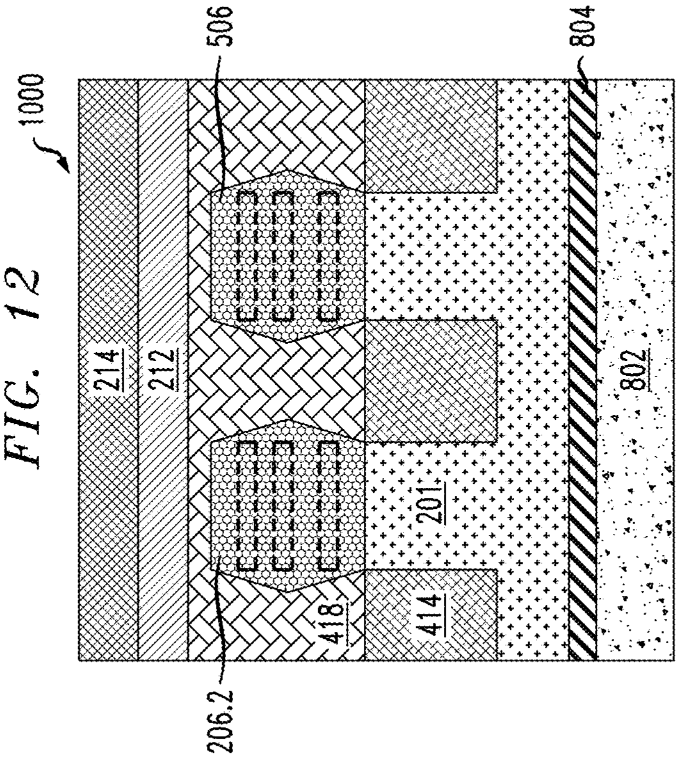
Figure 11:
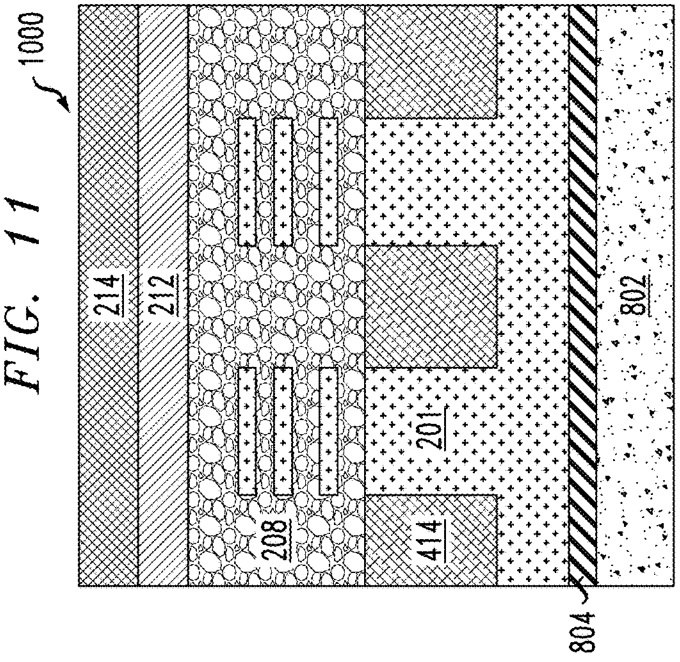

FIG. 10 through FIG. 12 show an intermediate structure 1000, in which silicon nitride layer 212 and silicon dioxide layer 214 have been deposited onto the previous structure 700. FIG. 11 and FIG. 12 are taken at a corresponding section line of FIG. 10.

Figure 15:
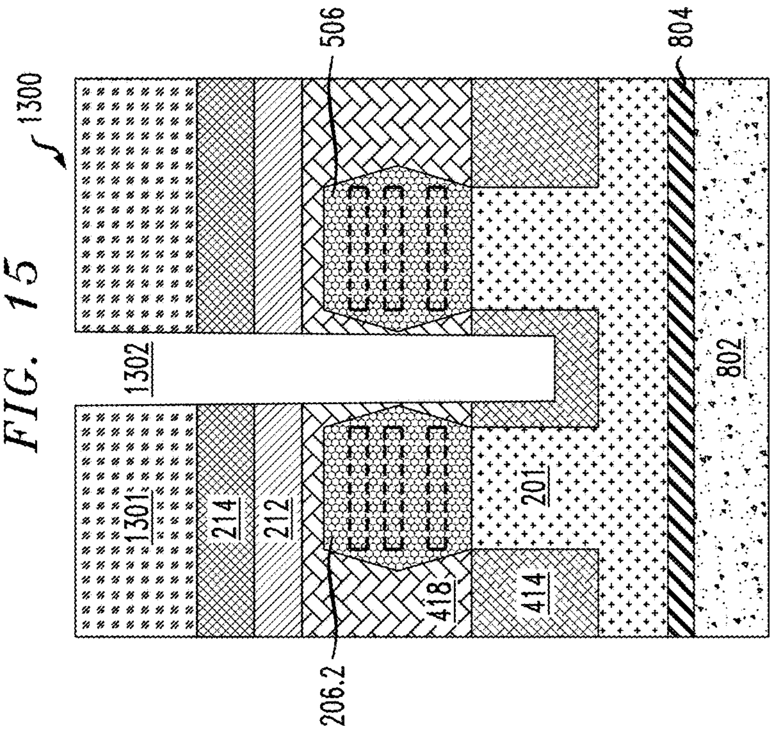
Figure 13:
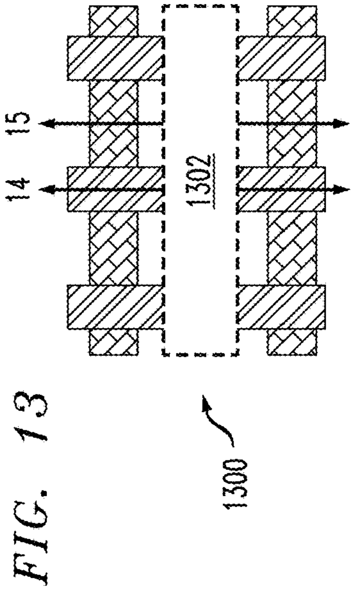
Figure 14:
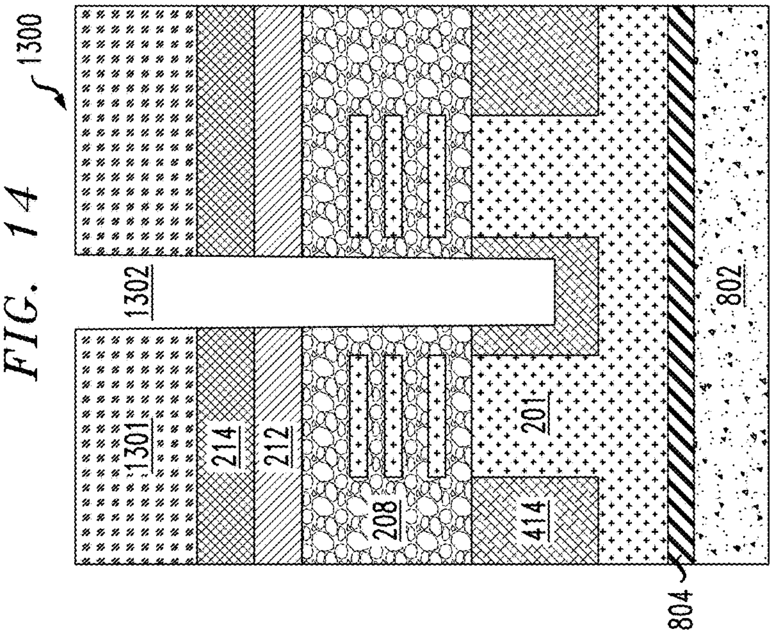

Referring to FIG. 13 through FIG. 15, gate cut 1302 is etched through OPL 1301 and into the gate 208 to form an intermediate structure 1300. FIG. 14 and FIG. 15 are taken at a corresponding section line of FIG. 13. The depicted structures can be formed using conventional lithography and etching processes.

Figure 16:
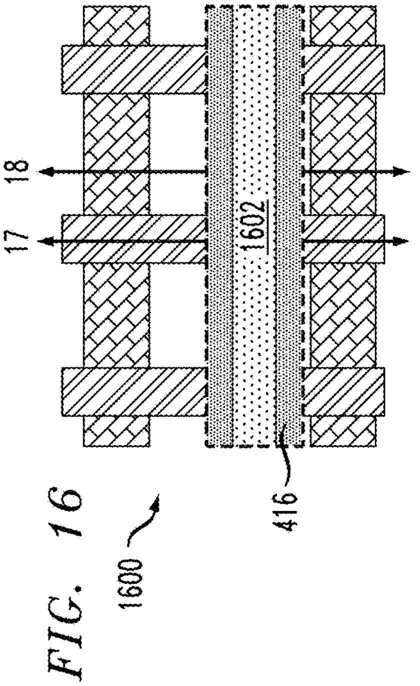
Figure 17:
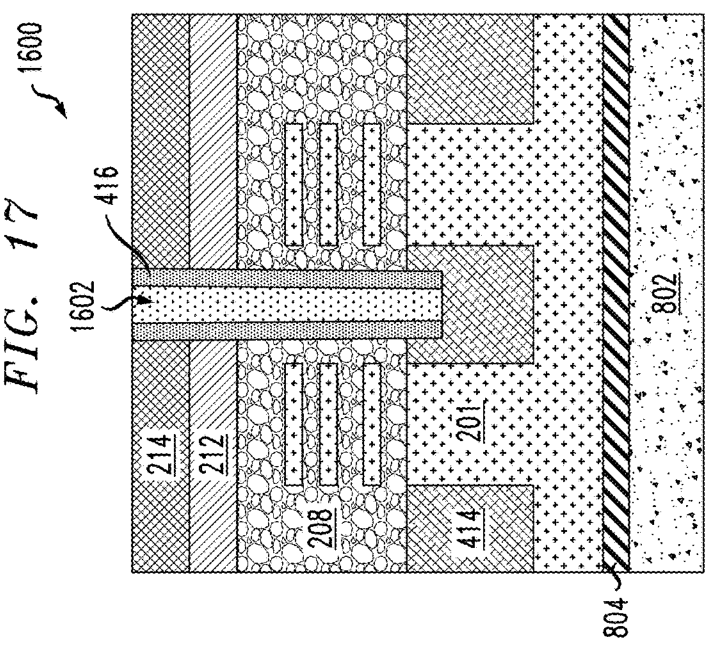
Figure 18:
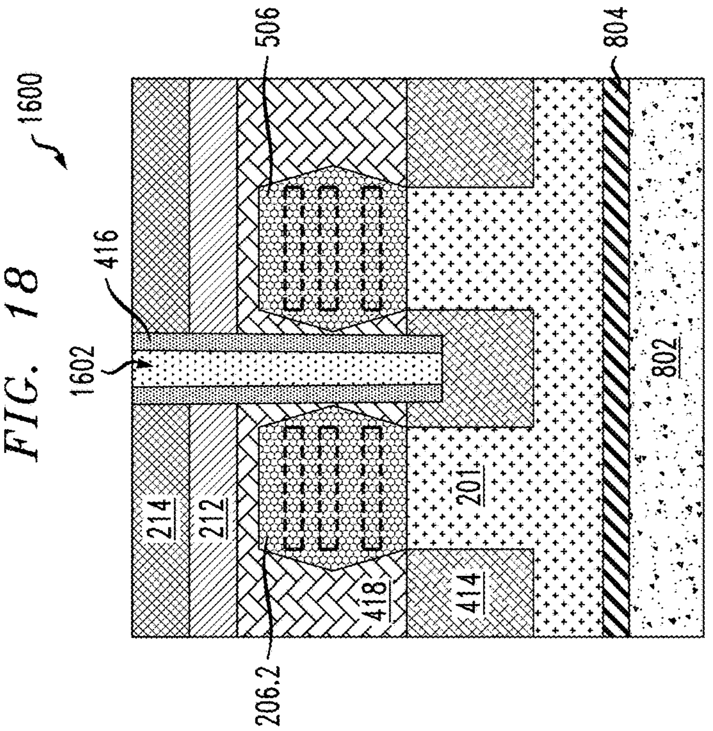

FIG. 16 through FIG. 18 depict an intermediate structure 1600, in which the dielectric spacer 416 and a dielectric fill 1602 have been deposited into the gate cut. FIG. 17 and FIG. 18 are taken at a corresponding section line of FIG. 16. Note that, in one or more embodiments, the dielectric spacer 416 is a carbide material, e.g. SiC or SiCO, whereas the dielectric fill 1602 is an oxide material, e.g., $SiO_2$, which will etch selective to the spacer 416.

Figure 19:
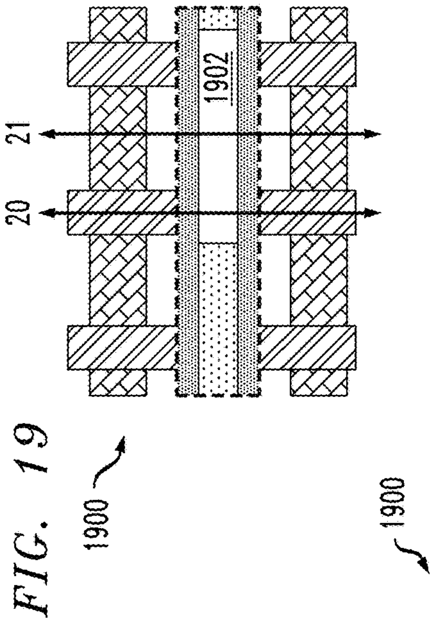
Figure 21:
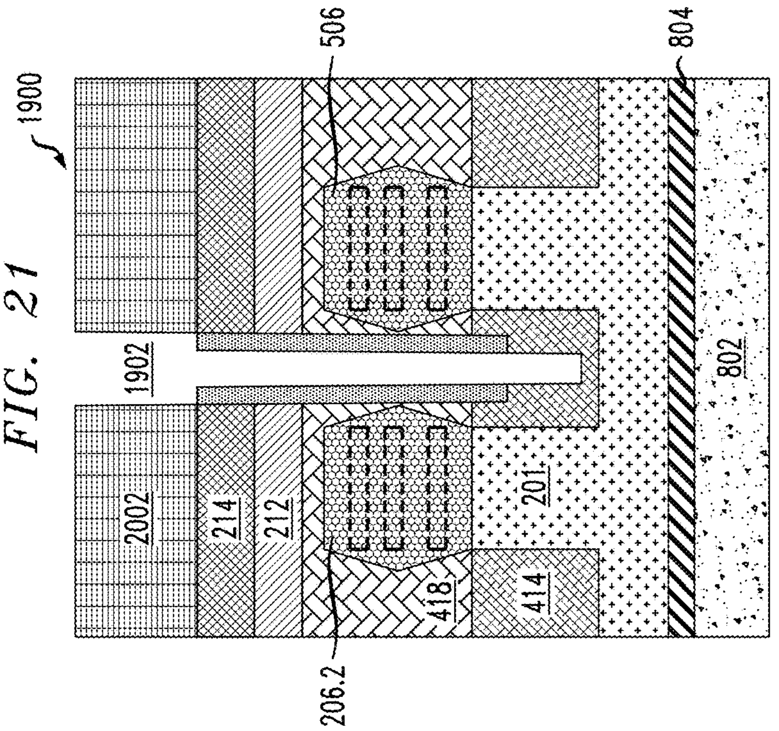
Figure 20:
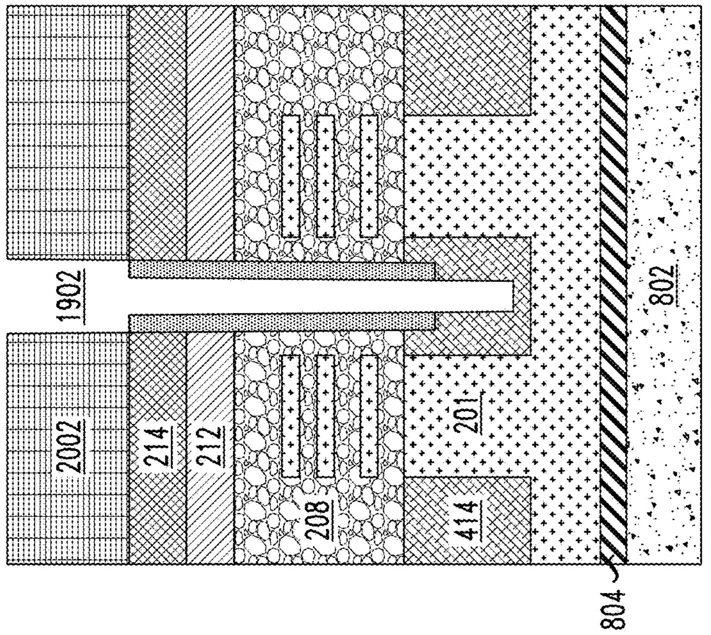

Referring to FIG. 19 through FIG. 21, OPL 2002 is deposited and patterned by conventional lithography and etching processes to define openings for power vias, then trench 1902 is etched into silicon dioxide layer 214, silicon nitride layer 212, dielectric fill 1602, and STI 414 to form intermediate structure 1900. FIG. 20 and FIG. 21 are taken at a corresponding section line of FIG. 19.

Figure 22:
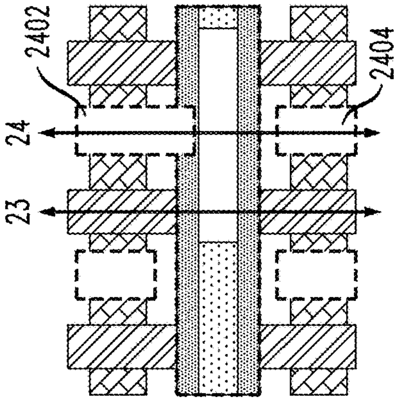
Figure 24:
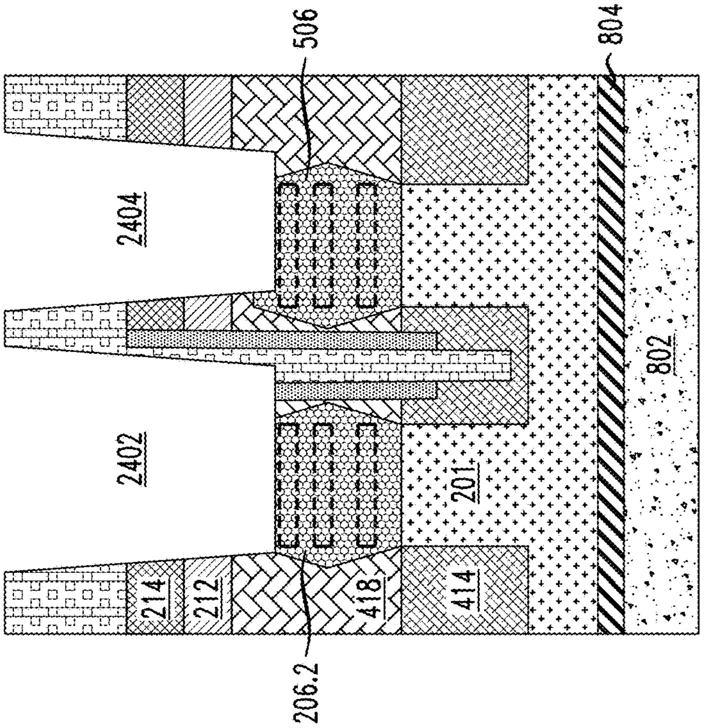
Figure 23:
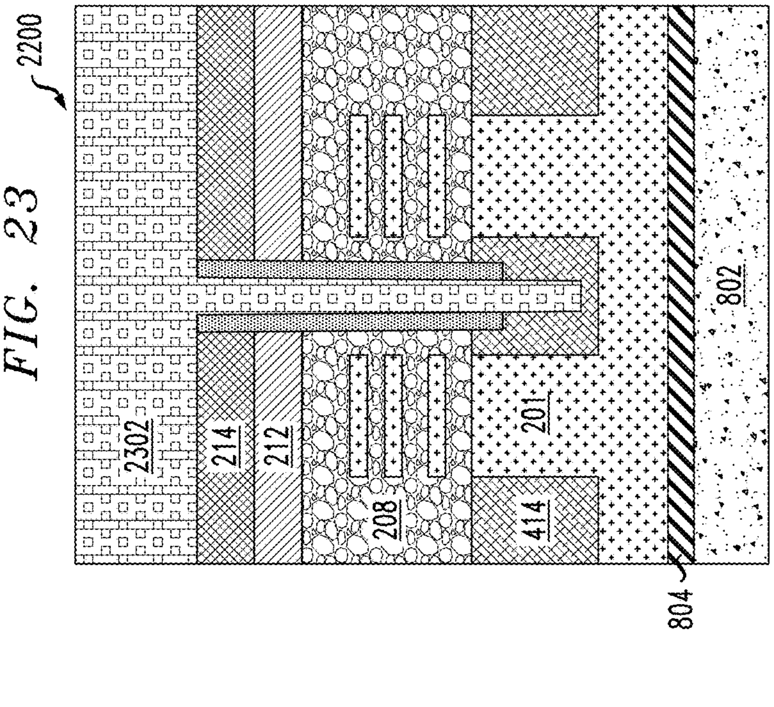
Figure 25:
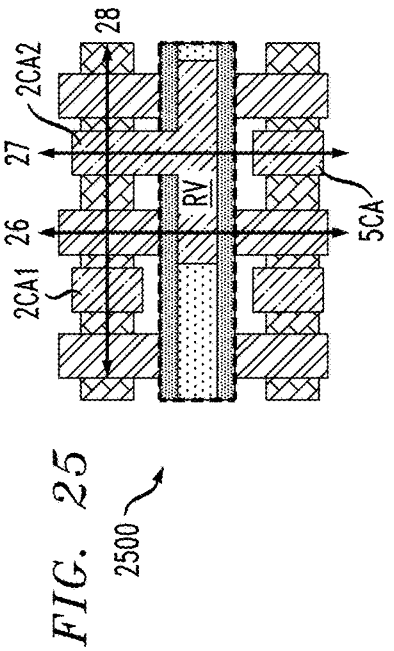

FIG. 22 through FIG. 24 show an intermediate structure 2200. FIG. 23 and FIG. 24 are taken at corresponding view lines in FIG. 22. In the intermediate structure 2200, OPL 2302 has been patterned according to conventional processes and source/drain contact trenches 2402, 2404 have been etched into silicon dioxide layer 214, silicon nitride layer 212, interlayer dielectric 418, and the source/drain structures 206.2, 506 using conventional lithography and etching processes. Methods for removing material during semiconductor fabrication are well known by the ordinary skilled worker; non-limiting examples are discussed below. Note that the OPL 2302 is new deposition. The previous OPL 2002 has been ashed.

Figure 28:
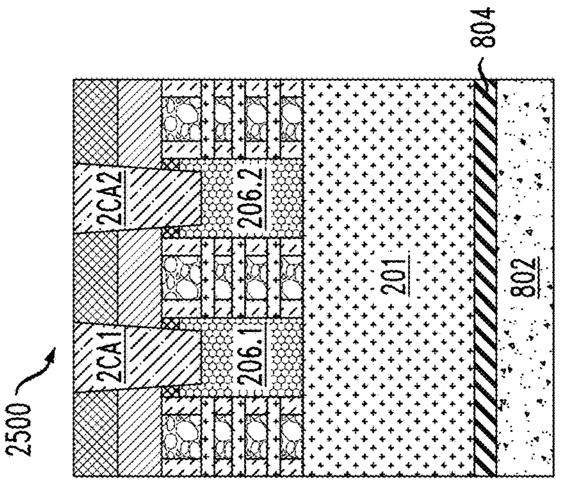
Figure 27:
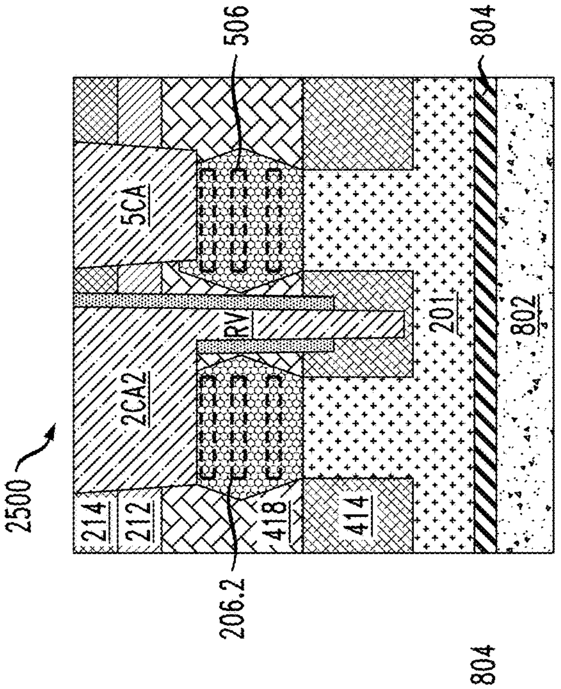
Figure 26:
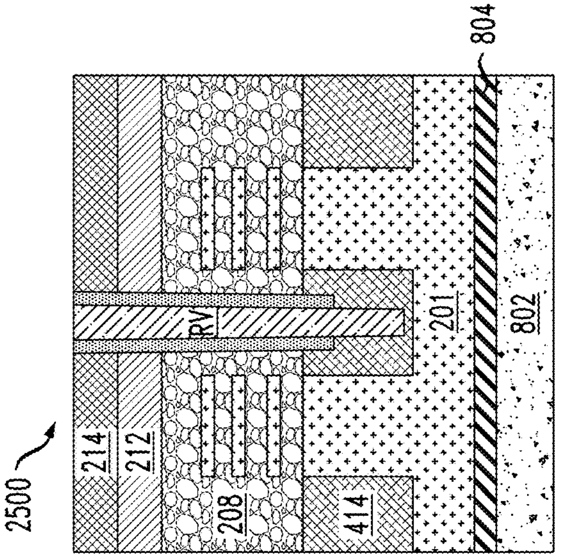
Figure 29:
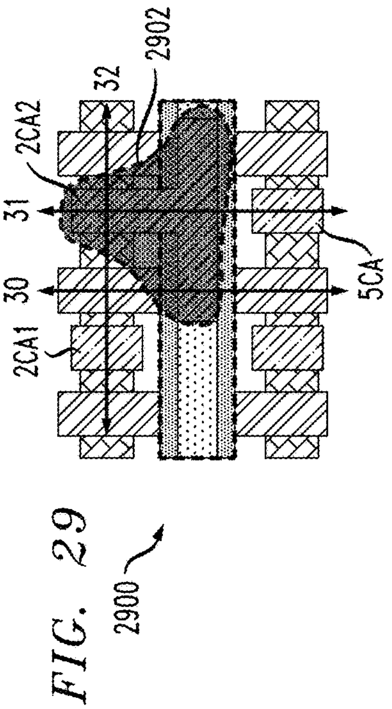

Referring to FIG. 25 through FIG. 28, power via RV is formed along with source/drain contacts 2CA1, 2CA2, 5CA in intermediate structure 2500. Each of FIG. 26 through FIG. 28 is taken at a corresponding section line of FIG. 25. The metallization process employs a silicide liner such as Ti, Ni or NiPt, followed by a thin metal adhesion layer, such as TiN, and low resistance metal fill, such as W, Ru, Co followed by CMP.

Figure 30:
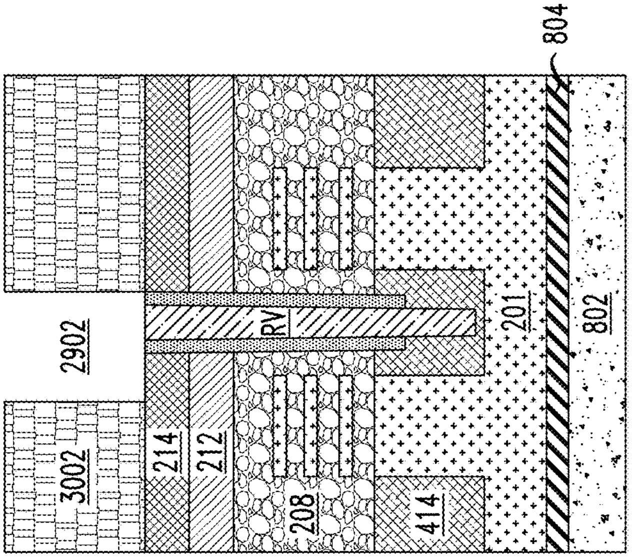
Figure 31:
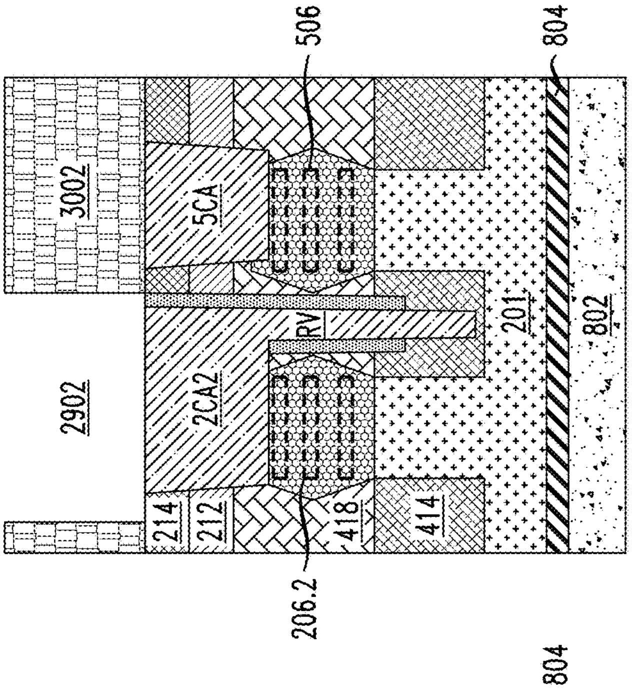
Figure 32:
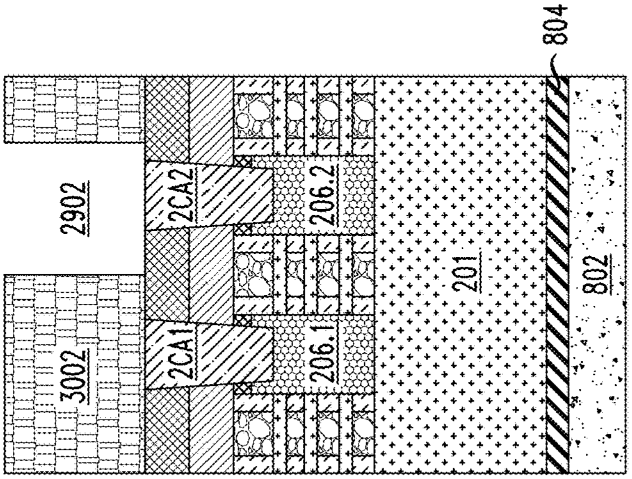

FIG. 29 through FIG. 32 depict an intermediate structure 2900. Each of FIG. 30 through FIG. 32 is taken at a corresponding section line of FIG. 29. In the intermediate structure 2900, a mask layer (such as OPL (organic planarization layer)) 3002 has been deposited and patterned to form an opening 2902 over the source/drain contact 2CA2 and the power via RV to define the regions for recessed via.

Figure 33:
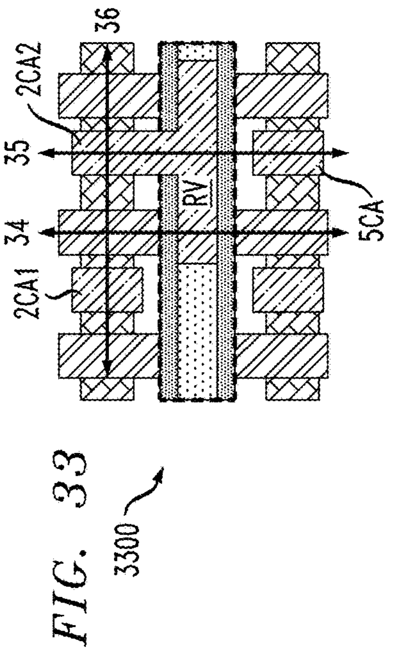
Figure 36:
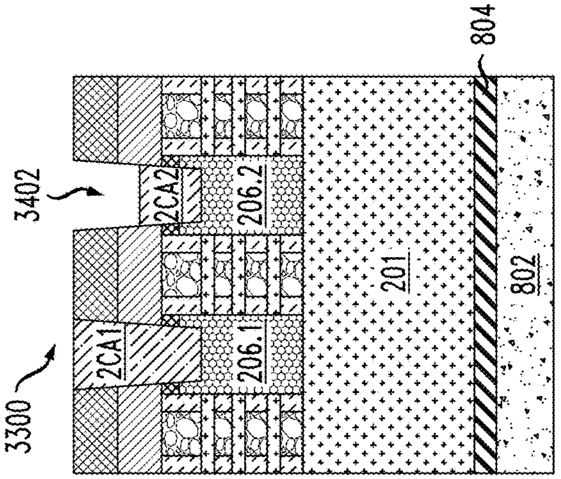
Figure 35:
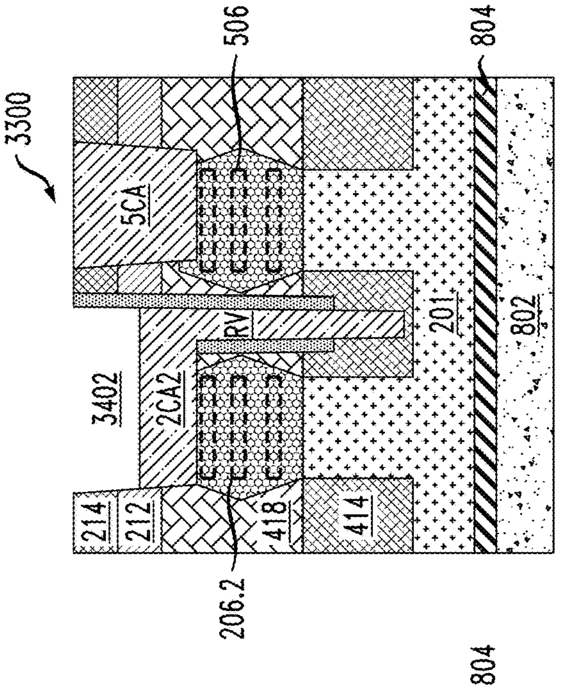
Figure 34:
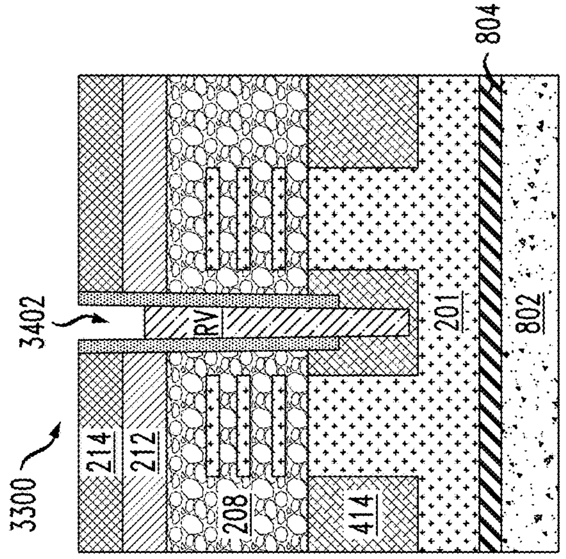
Figure 37:
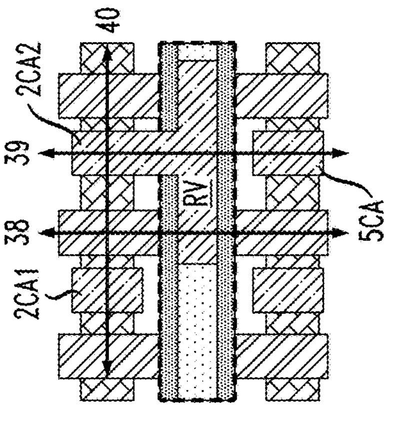

Referring to FIG. 33 through FIG. 36, each of FIG. 34 through FIG. 36 is taken at a corresponding section line of FIG. 33. In an intermediate structure 3300 the source/drain contact 2CA2 and the power via RV have been etched to form recessed vias so that their top surfaces are lower than the top surfaces of adjoining source/drain contacts, i.e. 2CA1 and 5CA. The etching forms a pocket 3402 in the silicon dioxide layer 214 and in the silicon nitride layer 212.

Figure 38:
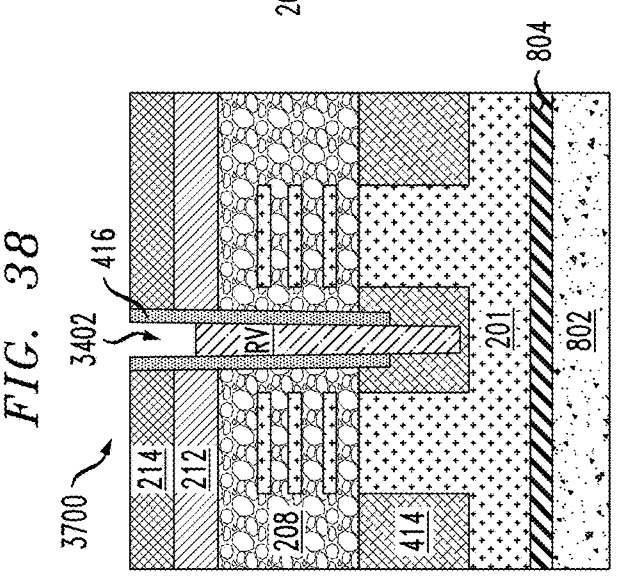
Figure 39:
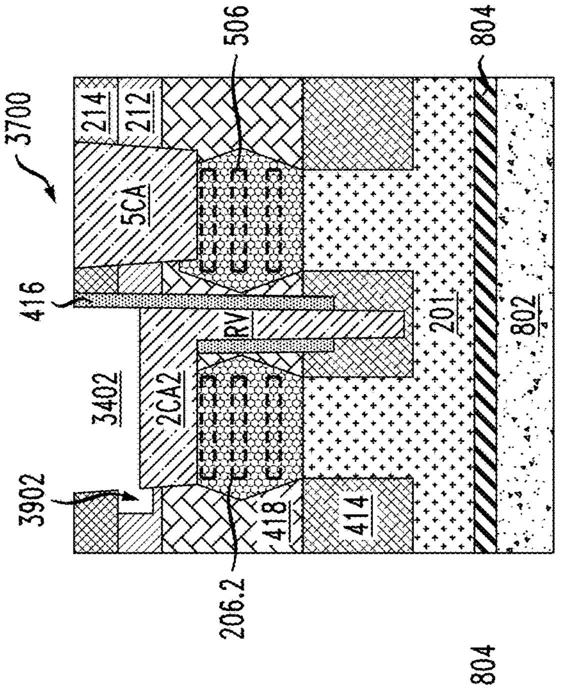
Figure 40:
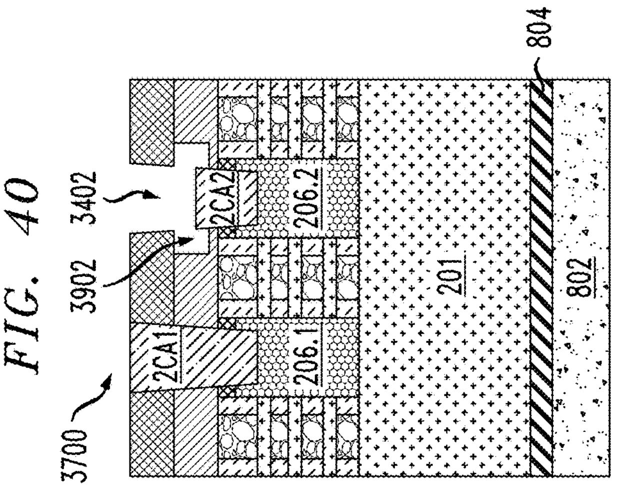
Figure 41:
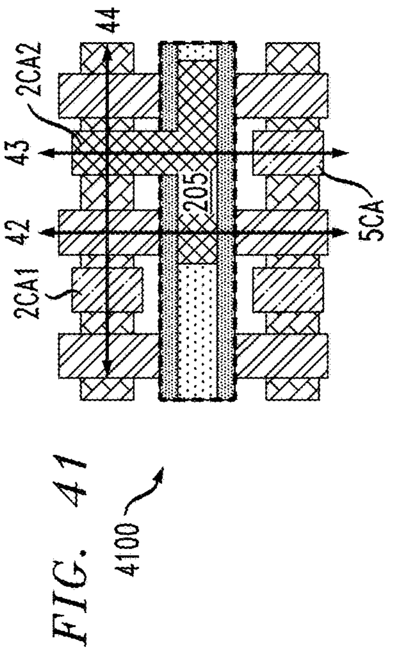

Next, as shown in FIG. 37 through FIG. 40, in an intermediate structure 3700 a channel or ring 3902 is etched around the bottom corner of the pocket 3402 at three sides of the source/drain contact 2CA2; the dielectric spacer 416 prevents the channel being etched all the way around the recessed via RV. Each of FIG. 38 through FIG. 40 is taken at a corresponding section line of FIG. 37.

Figure 42:
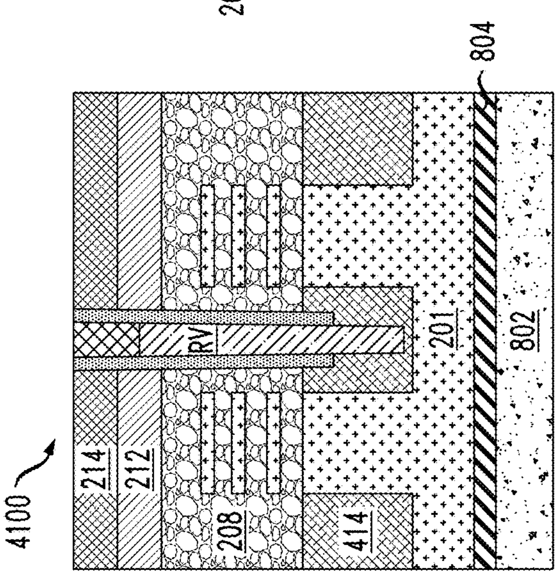
Figure 43:
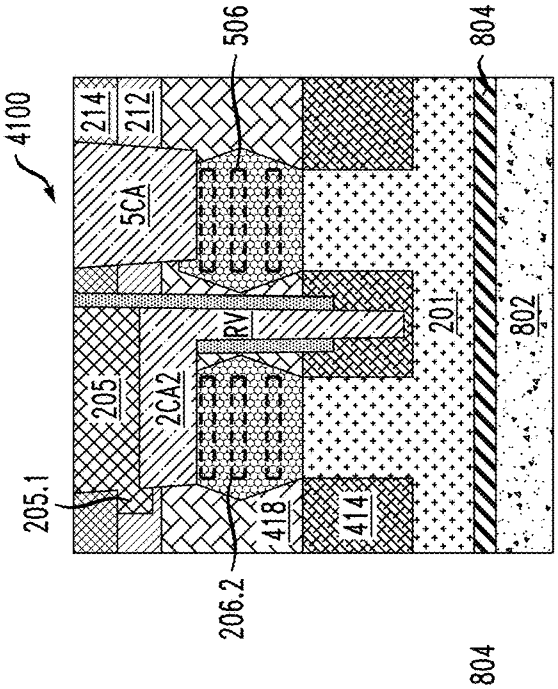
Figure 44:
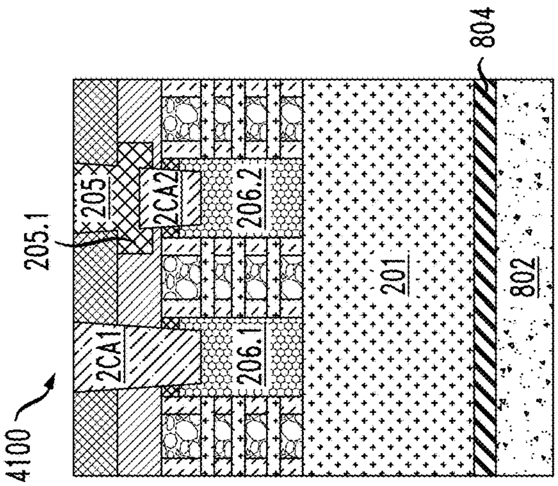
Figure 45:
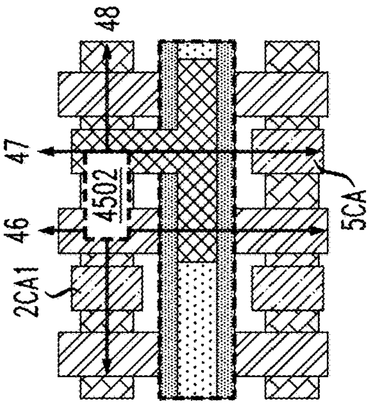

Referring to FIG. 41 through FIG. 44, the pocket and the channel are filled with a dielectric to form an intermediate structure 4100 that includes the dielectric cap 205, including the ear 205.1 that surrounds three edges of the source/drain contact 2CA2. Each of FIG. 42 through FIG. 44 is taken at a corresponding section line of FIG. 41.

Figure 48:
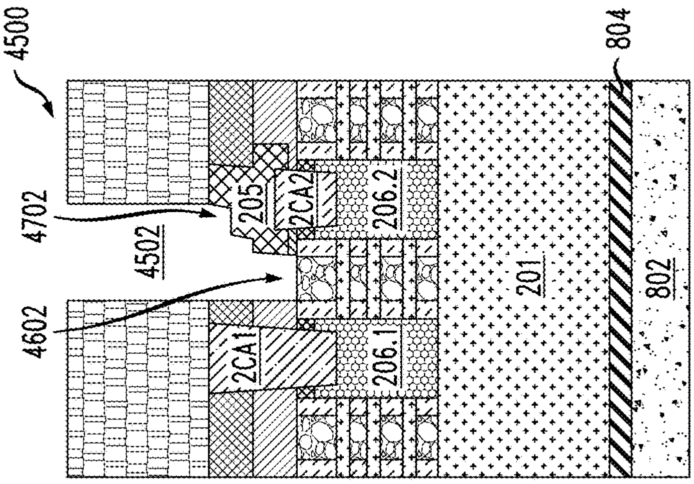
Figure 47:
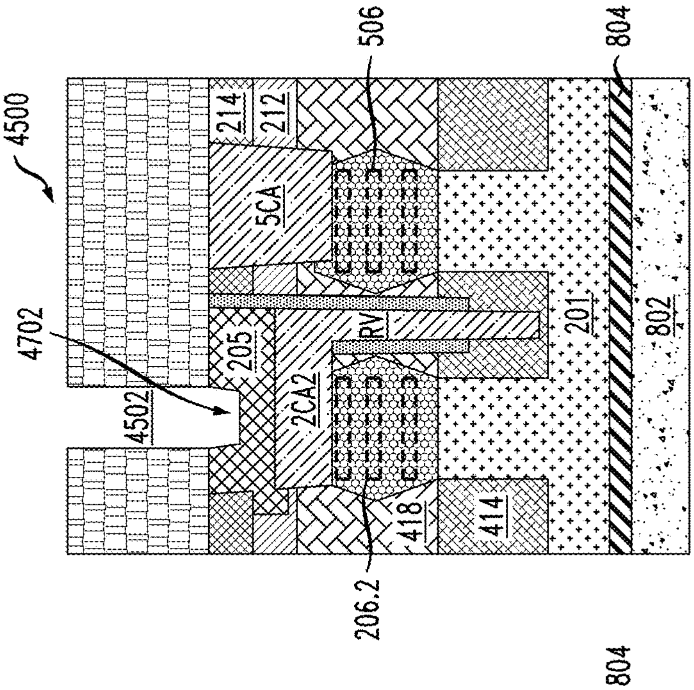
Figure 46:
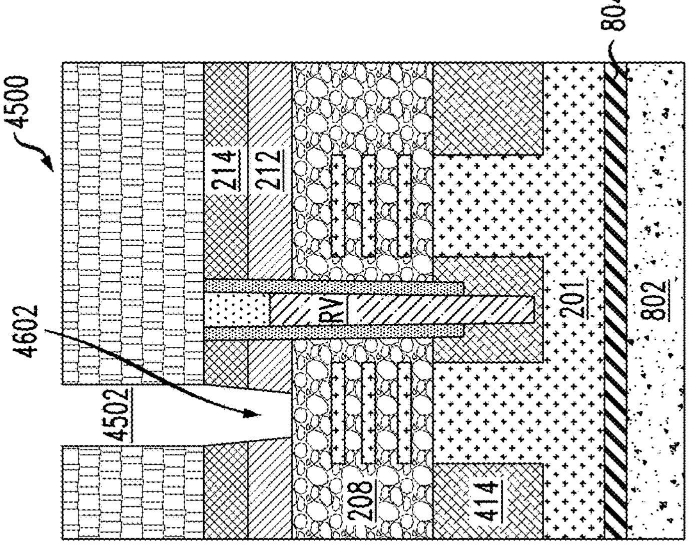
Figure 49:
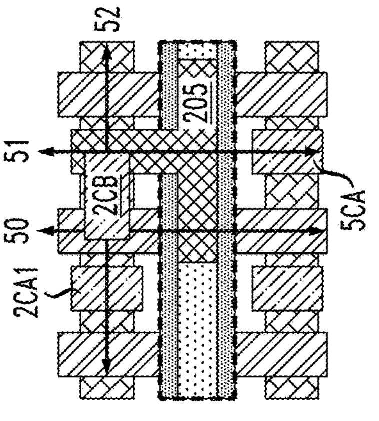

FIG. 45 through FIG. 48 depict an intermediate structure 4500, in which a gate contact trench 4502 has been etched through organic planarization layer (OPL) 4602 using conventional lithography and etching processes. Each of FIG. 46 through FIG. 48 is taken at a corresponding section line of FIG. 45. The trench 4502 includes a pit 4602 that touches the gate 208, as well as a groove 4702 in the dielectric cap 205. Because the dielectric cap 205 is a different material than the silicon dioxide or silicon nitride layers 212, 214, these layers can be etched selective to the dielectric cap 205. Suitable materials for the dielectric cap 205 include SiC, SiCO, AlOx, AlNx, and the like.

Figure 52:
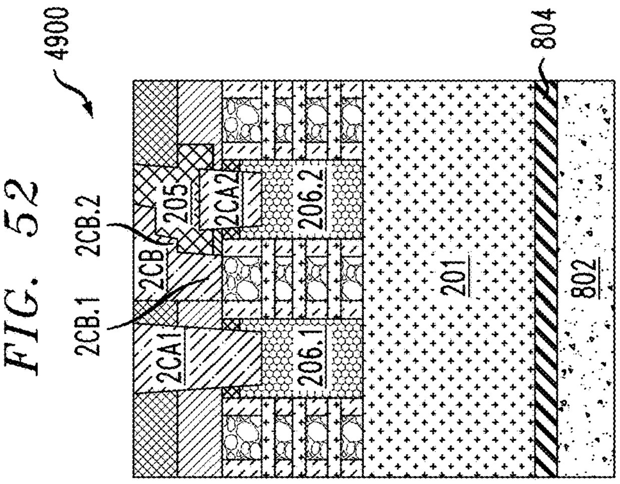
Figure 51:
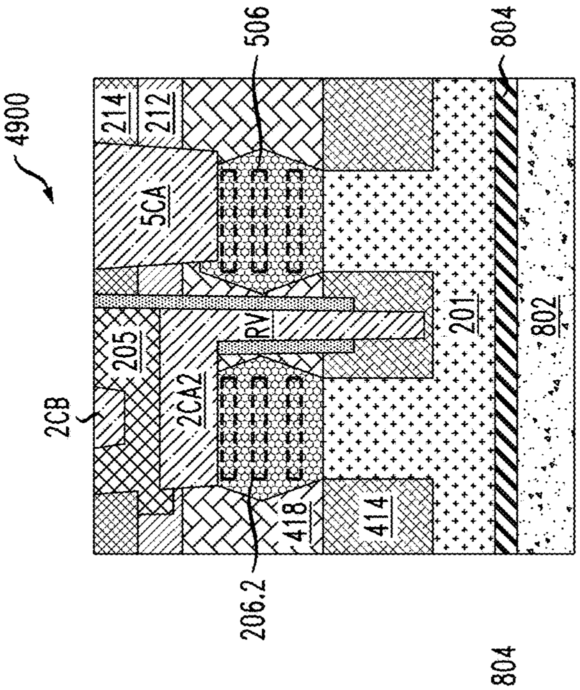
Figure 50:
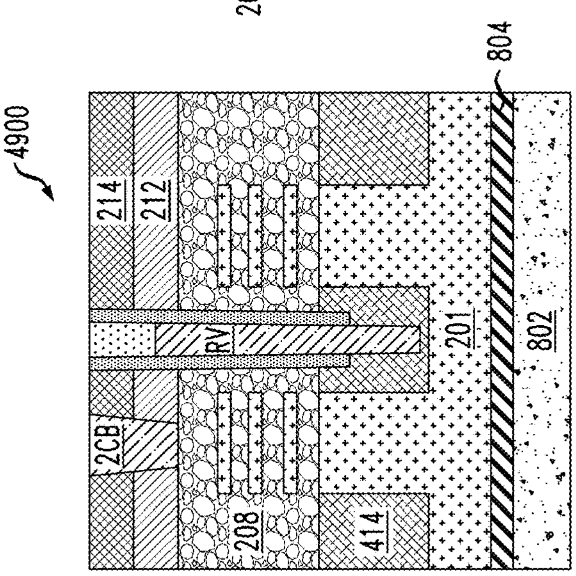
Figure 53:
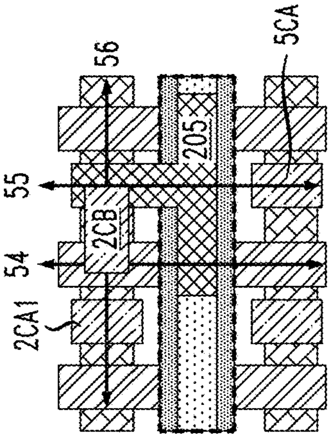

Referring to FIG. 49 through FIG. 52, an intermediate structure 4900 includes the gate contact 2CB, which has a leg 2CB.1 that touches the gate 208 as well as a nub 2CB.2 that is indented into the dielectric cap 205. Each of FIG. 50 through FIG. 52 is taken at a corresponding section line of FIG. 49.

Figure 54:
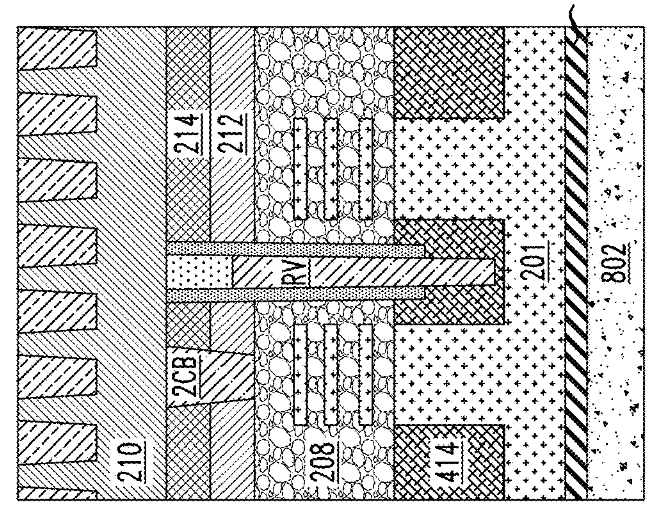
Figure 55:
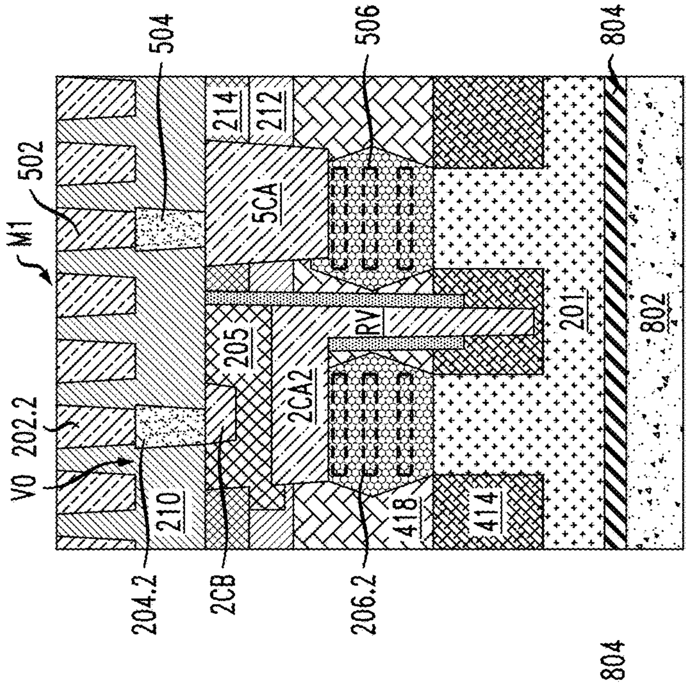
Figure 56:
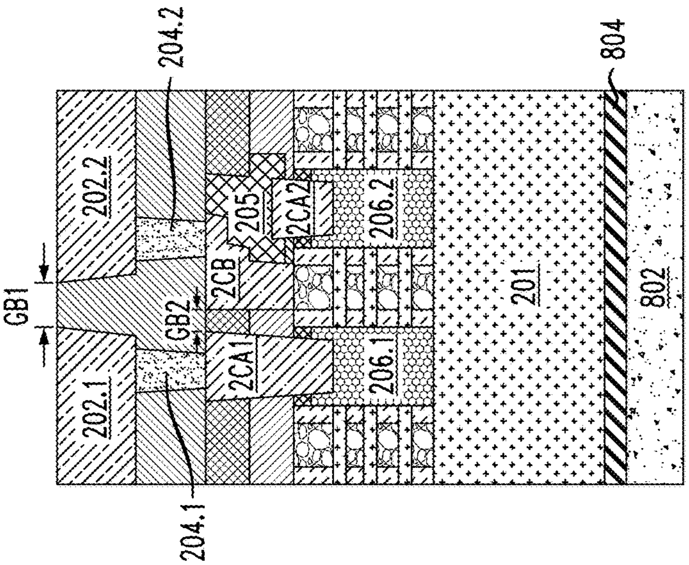

FIG. 53 through FIG. 56 depict an intermediate structure 5300 after forming vias 204.1, 204.2, 504 of the first via layer V0 and lines 202.1, 202.2, 502 of the first metal layer M1. Each of FIG. 54 through FIG. 56 is taken at a corresponding section line of FIG. 53. The structure of gate contact 2CB enables gaps 2GA, 2 GB (see FIG. 2) to be sufficiently large so that dielectric 210 does not break down at a gate voltage of up to 1V, even for critical dimensions of contact poly pitch (CPP) on the order of 45 nm.

Figure 59:
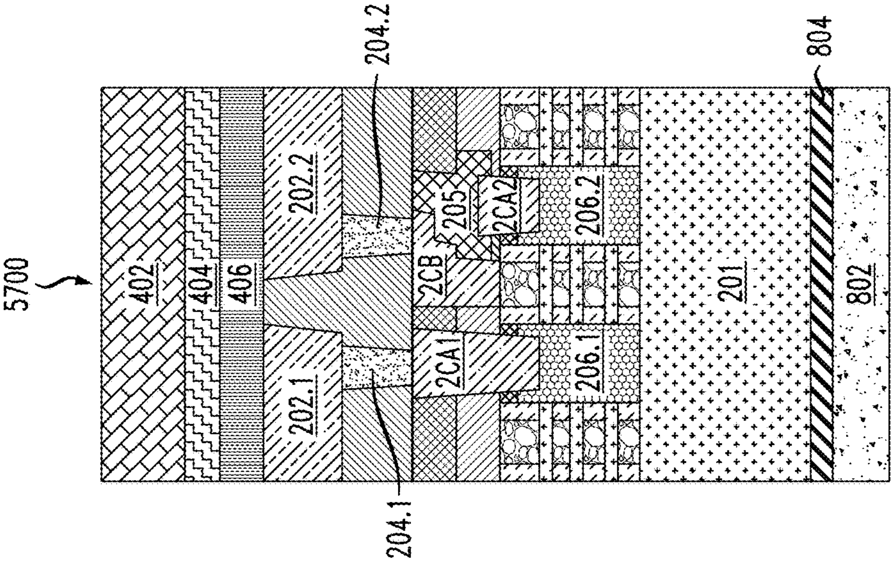
Figure 58:
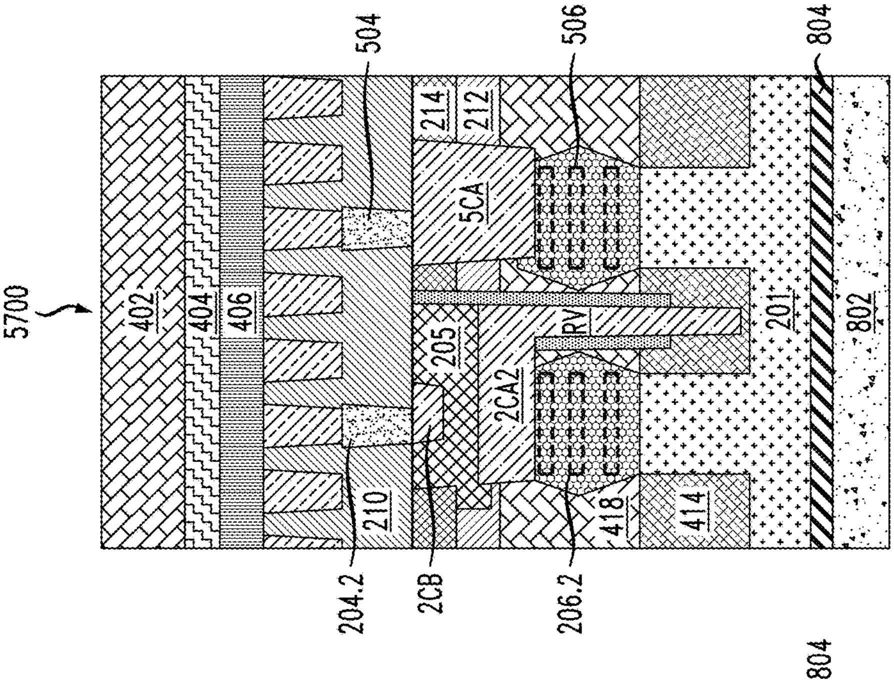
Figure 57:
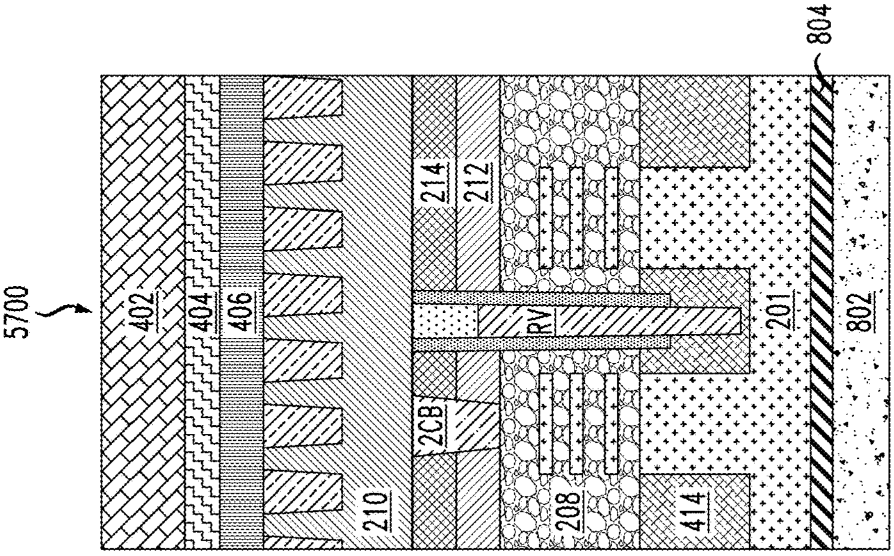
Figure 60:
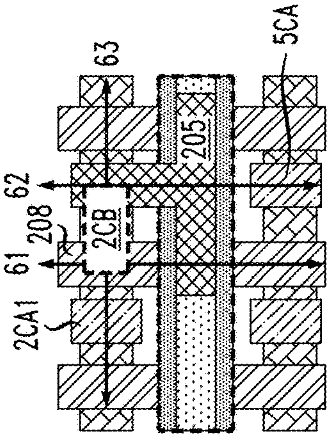

Referring to FIG. 57 through 59, intermediate structure 5700 also includes back end of line (BEOL) interconnect 406, bonding layer 404, and carrier wafer 402.

Figure 61:
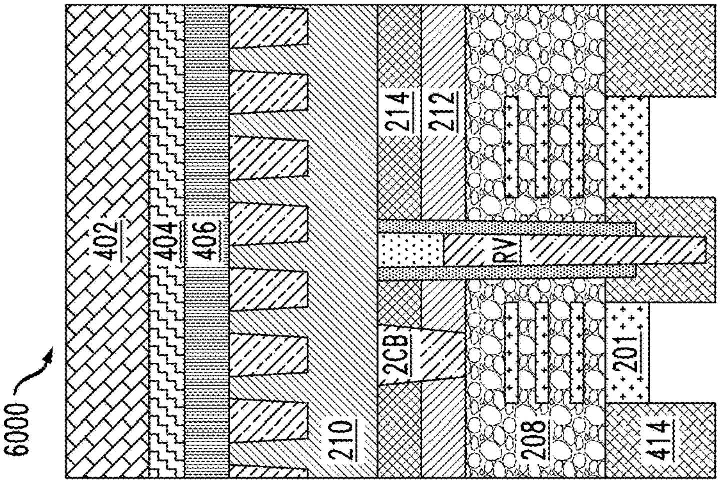
Figure 62:
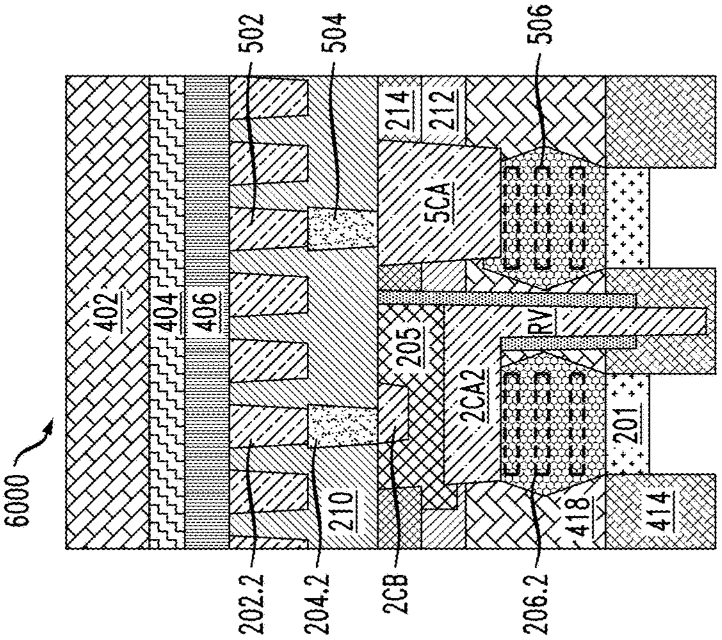

In FIG. 60 through 63, the wafer is flipped and the substrate layer and etch stop layer have been removed, to produce intermediate structure 6000, in which the substrate 201 is recessed between the shallow trench isolation 414. From here, the ordinary skilled worker will appreciate how to produce the final structure 200 that is shown in FIG. 2 through FIG. 6. Each of FIG. 61 through FIG. 63 is taken at a corresponding section line of FIG. 60.

FIG. 64, discussed in detail below, is a flow chart that depicts steps of a fabrication method 6400 that produces the intermediate structures described above en route to the final structure 200.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Various structures that are described herein, e.g., source/drain structures, may be epitaxially grown. “Epitaxy” or “epitaxial growth,” as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The Standard Clean 2 (SC2) contains a strong acid such as hydrochloric acid and hydrogen peroxide. The techniques and application of etching is well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Referring to FIG. 64, at 6402, in a MOSFET 2900 that has a plurality of source/drain structures 206.1, 206.2, 506 with corresponding source/drain contacts 2CA1, 2CA2, 5CA, wherein a first of the source/drain contacts 2CA2 is connected to a power via RV: etch the first source/drain contact and the power via so that their top surfaces are lower than top surfaces of adjacent source/drain contacts, thereby forming an intermediate structure 3300 (see FIGS. 33-36) that has a pocket 3402 in a layer of first dielectric 212 that is adjacent to the source/drain contacts.

At 6404, form an intermediate structure 3700 (see FIGS. 37-40) by etching a channel 3902 around the bottom corner of the pocket, such that the channel extends around three sides of an upper edge of the first source/drain contact.

At 6406, form an intermediate structure 4100 (see FIGS. 41-44) by filling the pocket and channel with a dielectric cap 205 that is a different material than the first dielectric.

At 6408, form an intermediate structure 4500 (see FIGS. 45-48) by etching a trench 4502 into the dielectric cap, and into an adjacent portion of the first dielectric, such that a bottom of the trench exposes a gate 208 that is connected to the source/drain structure of the first source/drain contact.

At 6410, form an intermediate structure 4900 (see FIGS. 49-52) by filling the trench with a gate contact 2CB that has a first end 2CB.2 overlying the first source/drain contact and has a second end 2CB.1 touching the gate at the bottom of the trench.

At 6412, deposit a first interlayer dielectric over the contacts.

At 6414, 6416, 6418, form an intermediate structure 5300 (see FIGS. 53-56) by forming a gate via 204.1 in the first interlayer dielectric and forming first and second source/drain vias 204.2, 504 in the first interlayer dielectric, wherein the gate via connects with the gate contact, the first source/drain via connects with the first source/drain contact, and the second source/drain via connects with a second source/drain contact that is adjacent to the gate contact; then depositing a second interlayer dielectric over the gate via and the source/drain vias; and then forming a first metal line in the second interlayer dielectric, wherein the first metal line connects to the gate via, and forming a second metal line in the second interlayer dielectric, wherein the second metal line connects to the second source/drain structure.

Given the discussion thus far, it will be appreciated that, in general terms, an exemplary MOSFET, according to an aspect of the invention, includes a semiconductor substrate 201 that has a frontside and a backside; a metal gate 208 at the frontside of the substrate; and a first source/drain structure 206.2 at the frontside of the substrate, adjacent to the metal gate in a first direction. Also included are a first source/drain contact 2CA2 at the frontside of the first source/drain structure; a backside power rail 408 at the backside of the substrate; and a recessed via RV that connects the first source/drain contact through the substrate to the backside power rail. The recessed via is adjacent to the first source/drain structure in a direction perpendicular to the first direction. A dielectric cap 205 covers a frontside of the first source/drain contact; and a gate contact 2CB is disposed at a frontside of the dielectric cap. The gate contact at least partly overlies the first source/drain contact.

In one or more embodiments, the MOSFET also includes a first metal line 202.2 at a frontside of the gate contact; a gate via 204.2 that connects the first metal line to the gate contact; a second source/drain structure 2CA1 at the frontside of the substrate, adjacent to the metal gate on an opposite side of the metal gate from the first source/drain structure; a second via 204.1 at a frontside of the second source/drain structure, and a first interlayer dielectric 210 between the gate via and the second via. A critical dimension of the gate is less than 12 nanometers (nm), a critical dimension of the second source/drain structure is less than 14 nm, a dielectric constant of the first interlayer dielectric is less than or equal to the dielectric constant of silicon dioxide, and a gap between the gate via and the second via is sufficiently large to avoid breakdown of the first interlayer dielectric under a gate bias voltage of up to 1 V.

In one or more embodiments, the MOSFET also includes a second metal line 202.1 at a frontside of the second via, and a second interlayer dielectric 210 between the second metal line and the first metal line. The second interlayer dielectric has a dielectric constant less than or equal to the dielectric constant of silicon dioxide. A gap between the first metal line and the second metal line is sufficiently large to avoid breakdown of the second interlayer dielectric under the gate bias voltage of up to 1 V. In one or more embodiments, the second interlayer dielectric is the same as the first interlayer dielectric.

In one or more embodiments, the dielectric cap 205 incorporates an ear 205.1 that protrudes between vertical surfaces of the first source/drain contact and the gate contact. In one or more embodiments, the ear 205.1 runs around three sides of the dielectric cap.

In one or more embodiments, the gate contact 2CB comprises a first portion 2CB1 that extends upward from the gate and a second portion 2CB2 that extends horizontally from the first portion over the dielectric cap. In one or more embodiments, the gate contact comprises a nub 2CB2 that protrudes from an inside corner of the first portion and the second portion into the dielectric cap.

In one or more embodiments, the recessed via RV is entirely below the dielectric cap.

In one or more embodiments, the MOSFET also includes a dielectric spacer 416 that electrically isolates the recessed via from the first source/drain structure. In one or more embodiments, the MOSFET also includes a third source/drain structure 506 and a corresponding third source/drain contact 5CA that are adjacent to the recessed via on the side opposite the first source/drain structure, and the dielectric spacer 416 electrically isolates the recessed via from the third source/drain structure and from the third source/drain contact.

According to another aspect, an exemplary method 6400 includes, in a MOSFET 2900 that has a plurality of source/drain structures with corresponding source/drain contacts, with a first of the source/drain contacts 2CA2 connected to a power via RV: etching the first source/drain contact and the power via so that their top surfaces are lower than top surfaces of adjacent source/drain contacts, thereby forming a pocket 3402 in a layer of first dielectric 214 that is adjacent to the source/drain contacts.

In one or more embodiments the method also includes etching a channel 3902 around the bottom corner of the pocket, such that the channel extends around three sides of an upper edge of the first source/drain contact.

In one or more embodiments the method also includes filling the pocket and channel with a dielectric cap 205 that is a different material than the first dielectric.

In one or more embodiments the method also includes etching a trench 4502 into the dielectric cap, and into an adjacent portion of the first dielectric, such that a bottom of the trench exposes a gate 208 that is connected to the source/drain structure 206.2 of the first source/drain contact 2CA2.

In one or more embodiments the method also includes filling the trench with a gate contact 2CB that has a first end 2CB2 overlying the first source/drain contact and has a second end 2CB1 touching the gate at the bottom of the trench.

In one or more embodiments the method also includes depositing a first interlayer dielectric 210 over the contacts.

In one or more embodiments the method also includes forming a gate via 204.2 in the first interlayer dielectric and forming first and second source/drain vias 204.1, 504 in the first interlayer dielectric. The gate via connects with the gate contact, the first source/drain via connects with the first source/drain contact, and the second source/drain via connects with a second source/drain contact that is adjacent to the gate contact. A critical dimension of the gate is less than 12 nanometers (nm), a critical dimension of a second source/drain structure that corresponds to the second source/drain contact is less than 14 nm, and a dielectric constant of the first interlayer dielectric is less than or equal to the dielectric constant of silicon dioxide. A gap 2GB between the gate via and the second source/drain via is sufficiently large to avoid breakdown of the first interlayer dielectric under a gate bias voltage of up to 1 V.

In one or more embodiments the method also includes depositing a second interlayer dielectric over the gate via and the source/drain vias.

In one or more embodiments the method also includes forming a first metal line 202.2 in the second interlayer dielectric, wherein the first metal line connects to the gate via; and forming a second metal line 202.1 in the second interlayer dielectric, wherein the second metal line connects to the second source/drain structure. The second interlayer dielectric has a dielectric constant less than or equal to the dielectric constant of silicon dioxide, and a gap 2GA between the first metal line and the second metal line is sufficiently large to avoid breakdown of the second interlayer dielectric under the gate bias voltage of up to 1 V.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A metal-oxide-semiconductor field effect transistor (MOSFET) comprising:
- a semiconductor substrate having a frontside and a backside;
- a metal gate at the frontside of the semiconductor substrate;
- a first source/drain structure at the frontside of the semiconductor substrate, the first source/drain structure being adjacent to the metal gate in a first direction;
- a first source/drain contact on the first source/drain structure;
- a backside power rail at the backside of the semiconductor substrate;
- a recessed via that connects the first source/drain contact through the semiconductor substrate to the backside power rail, wherein the recessed via is adjacent to the first source/drain structure in a second direction perpendicular to the first direction;
- a dielectric cap that covers a frontside of the first source/drain contact; and
- a gate contact that is disposed at a frontside of the dielectric cap;
- wherein the gate contact at least partly overlies the first source/drain contact in a layer above the first source/drain contact, and the dielectric cap separates the gate contact from the first source/drain contact at a region where the gate contact at least partly overlies the first source/drain contact.

2. The MOSFET of claim 1, further comprising:
- a first metal line at a frontside of the gate contact;
- a gate via that connects the first metal line to the gate contact;
- a second source/drain structure at the frontside of the semiconductor substrate, adjacent to the metal gate on an opposite side of the metal gate from the first source/drain structure;
- a second via at a frontside of the second source/drain structure; and
  - a first interlayer dielectric between the gate via and the second via;
- wherein a dimension of the metal gate along the first direction is less than 12 nanometers, a dimension of the second source/drain structure along the first direction is less than 14 nanometers, a dielectric constant of the first interlayer dielectric is less than or equal to the dielectric constant of silicon dioxide, and a gap between the gate via and the second via is sufficiently large to avoid breakdown of the first interlayer dielectric under a gate bias voltage of up to one volt.

3. The MOSFET of claim 2, further comprising:
- a second metal line at a frontside of the second via; and
- a second interlayer dielectric between the second metal line and the first metal line, wherein the second interlayer dielectric has a dielectric constant less than or equal to the dielectric constant of silicon dioxide;
- wherein a gap between the first metal line and the second metal line is sufficiently large to avoid breakdown of the second interlayer dielectric under the gate bias voltage of up to one volt.

4. The MOSFET of claim 3, wherein the first interlayer dielectric and the second interlayer dielectric are of the same dielectric material.

5. The MOSFET of claim 1, wherein the dielectric cap includes a protrusion of dielectric material that extends between a vertical surface of the first source/drain contact and a vertical surface of the gate contact.

6. The MOSFET of claim 5, wherein the protrusion extends around three sides of the first source/drain contact.

7. The MOSFET of claim 1, wherein the gate contact comprises a first portion that extends upward from the metal gate and a second portion that extends horizontally from the first portion over the dielectric cap.

8. The MOSFET of claim 7, wherein the gate contact includes a protrusion extending from an inside corner defined by the first portion and the second portion into the dielectric cap.

9. The MOSFET of claim 1, wherein the recessed via is entirely below the dielectric cap.

10. The MOSFET of claim 1, further comprising a dielectric spacer that electrically isolates the recessed via from the first source/drain structure.

11. The MOSFET of claim 10, further comprising a third source/drain structure and a corresponding third source/drain contact that are adjacent to the recessed via on a side of the recessed via opposite the first source/drain structure, wherein the dielectric spacer electrically isolates the recessed via from the third source/drain structure and from the corresponding third source/drain contact.

12. A semiconductor device comprising:
- a semiconductor substrate having a frontside and a backside;
- a metal gate at the frontside of the semiconductor substrate;
- a first source/drain structure at the frontside of the semiconductor substrate, the first source/drain structure being adjacent to the metal gate in a first direction;
- a first source/drain contact on the first source/drain structure;
- a backside power rail at the backside of the semiconductor substrate;
- a recessed via that connects the first source/drain contact through the semiconductor substrate to the backside power rail, wherein the recessed via is adjacent to the first source/drain structure in a second direction perpendicular to the first direction;
- a dielectric cap that covers a frontside of the first source/drain contact; and
- a gate contact that is disposed at a frontside of the dielectric cap;
- wherein the gate contact at least partly overlies the first source/drain contact in a layer above the first source/drain contact, and the dielectric cap separates the gate contact from the first source/drain contact at a region where the gate contact at least partly overlies the first source/drain contact.

13. The semiconductor device of claim 12, further comprising:

a first metal line at a frontside of the gate contact;

a gate via that connects the first metal line to the gate contact;

a second source/drain structure at the frontside of the semiconductor substrate, adjacent to the metal gate on an opposite side of the metal gate from the first source/drain structure;

a second via at a frontside of the second source/drain structure; and a first interlayer dielectric between the gate via and the second via;

wherein a dimension of the metal gate along the first direction is less than 12 nanometers, a dimension of the second source/drain structure along the first direction is less than 14 nanometers, a dielectric constant of the first interlayer dielectric is less than or equal to the dielectric constant of silicon dioxide, and a gap between the gate via and the second via is sufficiently large to avoid breakdown of the first interlayer dielectric under a gate bias voltage of up to one volt.

14. The semiconductor device of claim 13, further comprising:

a second metal line at a frontside of the second via; and a second interlayer dielectric between the second metal line and the first metal line, wherein the second interlayer dielectric has a dielectric constant less than or equal to the dielectric constant of silicon dioxide;

wherein a gap between the first metal line and the second metal line is sufficiently large to avoid breakdown of the second interlayer dielectric under the gate bias voltage of up to one volt.

15. The semiconductor device of claim 12, wherein the dielectric cap includes a protrusion of dielectric material that extends between a vertical surface of the first source/drain contact and a vertical surface of the gate contact.

16. The semiconductor device of claim 15, wherein the protrusion extends around three sides of the first source/drain contact.

17. The semiconductor device of claim 12, wherein the gate contact includes a first portion that extends upward from the metal gate, a second portion that extends horizontally from the first portion over the dielectric cap, and a protrusion extending from an inside corner defined by the first portion and the second portion into the dielectric cap.

18. The semiconductor device of claim 12, wherein the recessed via is entirely below the dielectric cap.

19. The semiconductor device of claim 12, further comprising a dielectric spacer that electrically isolates the recessed via from the first source/drain structure.

20. The semiconductor device of claim 19, further comprising a third source/drain structure and a corresponding third source/drain contact that are adjacent to the recessed via on a side of the recessed via opposite the first source/drain structure, wherein the dielectric spacer electrically isolates the recessed via from the third source/drain structure and from the corresponding third source/drain contact.

* * * * *